United States Patent [19]
Sakoh

[11] Patent Number: 6,020,092
[45] Date of Patent: Feb. 1, 2000

[54] PARTIAL ONE-SHOT ELECTRON BEAM EXPOSURE MASK AND METHOD OF FORMING A PARTIAL ONE-SHOT ELECTRON BEAM EXPOSURE PATTERN

[75] Inventor: Takashi Sakoh, Tokyo, Japan

[73] Assignee: NEC Corporation, Tokyo, Japan

[21] Appl. No.: 09/019,204

[22] Filed: Feb. 5, 1998

[30]    Foreign Application Priority Data

Feb. 6, 1997   [JP]   Japan ..................................... 9-023591

[51] Int. Cl.⁷ ...................................................... G03F 9/00
[52] U.S. Cl. ............................................... 430/5; 430/311
[58] Field of Search ................................. 430/5, 296, 311

[56]              References Cited

U.S. PATENT DOCUMENTS 5,849,437  12/1998  Yamazaki et al. ...................... 430/296

*Primary Examiner*—S. Rosasco
*Attorney, Agent, or Firm*—Young & Thompson

[57]              ABSTRACT

A partial one-shot exposure mask is provided for exposure, by repeating the patterns, of a photo-resist formed over active and isolation regions of a semiconductor device, wherein boundaries of patterns of the partial one-shot exposure mask are positioned only in the isolation region. The patterns of the partial one-shot exposure mask may be for formation of word lines. In this case, the boundaries of the patterns of the partial one-shot exposure mask may be formed in a direction perpendicular to a longitudinal direction of the word lines. Alternatively, the boundaries of the patterns of the partial one-shot exposure mask may be formed in a direction parallel to an active region. All of regions for formations of contact holes are included in the active region.

11 Claims, 25 Drawing Sheets

PARTIAL ONE-SHOT ELECTRON BEAM EXPOSURE MASK AND METHOD OF FORMING A PARTIAL ONE-SHOT ELECTRON BEAM EXPOSURE PATTERN

BACKGROUND OF THE INVENTION

The present invention relates to a partial one-shot electron beam exposure mask and a method of forming a partial one-shot electron beam exposure pattern.

In recent years, the density of integration of a semiconductor integrated circuit has been increasing. In case of dynamic random access memory, the density of integration of the integrated circuit has increased four times for every three years, for example, from 16 megabits of 0.5 micrometers in size, 64 megabits of 0.35 micrometers in size, to 256 megabits of 0.25 micrometers in size.

One gigabit dynamic random access memory scaled down to 0.16 micrometers is the memory in the next generation. However, the size of 0.16 micrometers is beyond the limitation of the resolution of the optical exposure. In order to further scale down the pattern, an electron beam exposure is available.

The available electron beam exposure is classified into a variable shaped beam method and cell projection method. In the variable shaped beam method, individual patterns are sequentially formed. In the cell projection method, a plurality of masks are prepared which have repeating patterns so that the mask is used for one-shot electron beam exposure to form the repeating pattern.

FIG. 1 is a plan view illustration of a mask to be used for a partial one-shot electron beam exposure. The partial one-shot electron beam exposure mask has a pattern of stripe-shaped opening portions 91. The partial one-shot electron beam exposure mask 90 is placed on a photo-resist film so that the electron beam is irradiated onto the partial one-shot electron beam exposure mask 90 whereby the photo-resist film is selectively exposed to the electron beams having passed through the openings 91 of the mask 90 to form a desired photo-resist pattern.

FIG. 2 is a view illustrative of sequential and repeating electron beam exposures by use of the partial one-shot electron beam exposure mask having the openings as a unit pattern. The partial one-shot electron beam exposure mask having the openings as a unit pattern is used repeatedly to carry out sequential electron beam exposures with displacements of the mask in lateral and vertical directions A and B.

FIG. 3 is a view illustrative of a photo-resist pattern obtained by the sequential electron beam exposures carried out by displacement of the mask in lateral and vertical directions "A" and "B". A unit pattern 92 is formed by a partial one-shot electron beam exposure by use of the partial one-shot electron beam exposure mask having the openings as a unit pattern. Boundaries of the partial one-shot electron beam exposure mask having been repeatedly used comprise opposite vertical boundary lines 95 and opposite lateral boundary lines 94. As a result of the sequential and repeated one-shot electron beam exposures by use of the mask, a photo-resist pattern 93 can be obtained.

For realizing the above sequential and repeating one-shot electron beam exposures, an accurate alignment of the partial one-shot electron beam exposures mask is essential. Actually, however, it is difficult to avoid some displacement of the mask over the photo-resist film.

FIGS. 4A and 4B illustrate a displacement of the one-shot electron beam exposure mask in sequential and repeating one-shot electron beam exposures and an influence of the displacement on the pattern formed by the mask. When the mask is aligned in the intermediate region, a downward displacement of the mask appears, whereby a gap 96 is formed between the top and intermediate regions whilst an overlap 97 is caused between the intermediate and bottom regions. The broken lines 95 represent the opposite lateral boundary lines 95 of the mask. As a result of the sequential and repeated one-shot electron beam exposures using the mask, photo-resist patterns are obtained which have pinched portions 98 at a position corresponding to the gap 96 and expanding portions 99 at a different position corresponding to the overlap 97. If the displacement of the mask is large, then a disconnection of the photo-resist pattern may appear. Also if the displacement of the mask is large, then extensively expanding portions of the adjacent photo-resist patterns may be made into contact with each other.

Japanese laid-open patent publication No.: 62-206829 suggests intentionally overlapping portions of the mask to avoid the disconnection of the photo-resist pattern.

Japanese laid-open patent publication No. 2-170411 suggests intentionally displacing in the vertical direction two adjacent photo-resist patterns relative to each other so that the extensively expanding portions of the adjacent photo-resist patterns are different in levels in the vertical direction as illustrated in FIG. 5 which is illustrative of a partial one-shot electron beam exposure mask for causing the intentional displacement in the vertical direction of the adjacent photo-resist patterns relative to each other. The partial one-shot electron beam exposure mask 100 has stripe-shaped openings 101 which are displaced in the vertical direction to each other.

Japanese laid-open patent publication No. 2-71509 discloses that the opposite ends of each stripe-shaped opening of the mask have smaller width portions than the line width of the stripe-shaped opening so that a double exposure is caused at the smaller width portions so as to suppress the variation in size of the photo-resist patterns.

For the foregoing prior art, it is, however, difficult to settle the problem with variation in size of the photo-resist patterns.

Considering the use of the partial one-shot mask 100 as illustrated in FIG. 5, a photo-resist pattern is obtained as illustrated in FIG. 6. FIG. 6 is a view illustrative of a positional relationship of pinched and expended portions of word lines prepared by the use of the partial one-shot exposure mask in relation to active regions on which elements are formed. Cross hatched portions represent the gate electrode of the field effect transistors. The width of the word line 2 over the active region 1 sets a gate length of the field effect transistor formed in the active region 1. If, for example, the expanding portion 104 is positioned in the active region 1, this means the gate length is longer than the predetermined gate length. If, however, the pinched portion 102 is positioned in the active region 1, then this means the gate length is shorter than the predetermined gate length. If neither one expanding portion nor the pinched portion is formed in the active region 1 and the width of the word line is just the predetermined value 103, this means that the gate length also has the predetermined value 103. Namely, some variation in gate length is unavailable. If the gate length is shortened, then the leakage of current of the transistor in OFF-state is increased. If, in contrast, the gate length is increased, then the channel resistance is increased whereby the ON-current of the transistor is reduced. As a result, the capability of writing into the memory cell is deteriorated.

Such variation in characteristics of the memory cell transistor reduces the yield of the memory cell chip.

In case of the dynamic random access memory, a distance between the word line and the bit contact is narrower than a distance between the interconnections, for which reason the expanded portions of the word lines may approach or be made into contact with the bit contact whereby a short circuit is formed between the word line and the bit contact.

FIG. 7 is a plan view illustrative of a positional relationship between the expanded and pinched portions of the word lines and bit contact holes formed between the word lines. Even if, neither the expanded portion nor the pinched portion is formed in the active region 1, it is possible that the expanded portion 106 is formed adjacent to the bit contact hole 7 whereby a short circuit is formed between the word line and the bit contact. If, however, the pinched portion 102 is formed adjacent to the bit contact hole 7, then no problem is raised. If neither the expanded portion nor the pinched portion is formed adjacent to the bit contact hole 7 and the word line portion 105 adjacent to the bit contact hole 7 has a predetermined width, then there is no problem raised like the short circuit that is formed between the word line and the bit contact.

FIG. 8 is a fragmentary cross sectional elevation view illustrative of word lines and bit contact holes taken along an VIII—VIII line of FIG. 7.

A semiconductor substrate 100 has an isolation region 113 and an active region on which elements 1 are formed. Field oxide films 114 are selectively formed on the isolation region 113 to define the active region. Diffusion layers 111 are formed on the active region X. Word lines 2 are formed over the field oxide films 114. An inter-layer insulator 112 is formed over the word lines 2 and field oxide films 114 wherein the inter-layer insulator 112 has bit contact holes 7 which are positioned over the diffusion layers 111. The word lines 2 have the expanded portions adjacent to the bit contact holes 7, for which reason the word lines 2A illustrated in FIG. 8 are displaced to be shown on the side walls of the bit contact holes 7. If the bit contacts made of an electrically conductive material are formed in the bit contact holes 7, then the bit contacts contact the expanded portions 2A of the word lines 2 whereby the short circuits are formed between the bit contacts and the word lines. As a result, the yield of the chip decreases.

In the above circumstances, it had been required to develop a novel partial one-shot electron beam exposure mask and a method of forming a partial one-shot electron beam exposure pattern free from the above problems.

SUMMARY OF THE INVENTION

Accordingly, it is an object of the present invention to provide a novel partial one-shot electron beam exposure mask free from the above problems.

It is a further object of the present invention to provide a novel partial one-shot electron beam exposure mask free of a problem with a gate length variation of a transistor even if a word line is varied in width due to a displacement of the partial one-shot electron beam exposure mask.

it is a still further object of the present invention to provide a novel partial one-shot electron beam exposure mask free of a short circuit between a bit contact and a word line even if a word line is varied in width due to a displacement of the partial one-shot electron beam exposure mask.

It is yet a further object of the present invention to provide a novel method of forming a partial one-shot electron beam exposure pattern free from the above problems.

It is a further more object of the present invention to provide a novel method of forming a partial one-shot electron beam exposure pattern free of a problem with a gate length variation of a transistor even if a word line is varied in width due to a displacement of the partial one-shot electron beam exposure mask.

It is still more an object of the present invention to provide a novel method of forming a partial one-shot electron beam exposure pattern free of a problem with a formation of a short circuit between a bit contact and a word line even if a word line is varied in width due to a displacement of the partial one-shot electron beam exposure mask.

The above and other objects, features and advantages of the present invention will be apparent from the following description.

In accordance with the present invention, a partial one-shot exposure mask is provided for exposure, by repeating patterns, of a photo-resist formed over active and isolation regions of a semiconductor device, wherein boundaries of patterns of the partial one-shot exposure mask are positioned only in the isolation region. The patterns of the partial one-shot exposure mask may be for formation of word lines. In this case, the boundaries of the patterns of the partial one-shot exposure mask may be formed in a direction perpendicular to a longitudinal direction of the word lines. Alternatively, the boundaries of the patterns of the partial one-shot exposure mask may be formed in a direction parallel to an active region. All of the regions for formation of contact holes are included in the active region.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1:
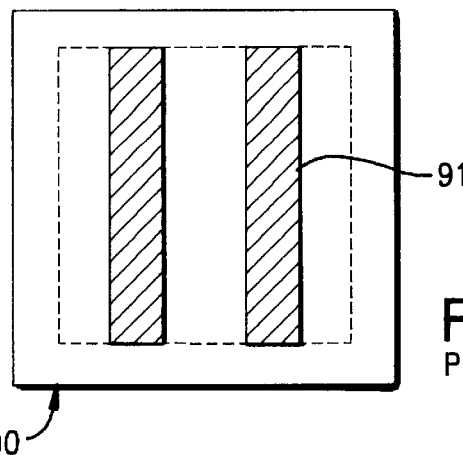
FIG. 1 is a plan view illustrative of a mask to be used for a partial one-shot electron beam exposure.
Figure 2:
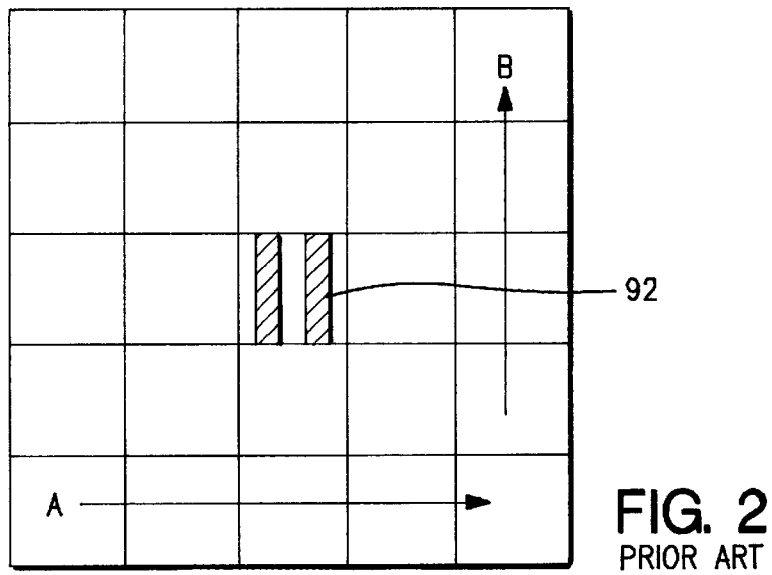
FIG. 2 is a view illustrative of sequential and repeating electron beam exposures by use of the partial one-shot electron beam exposure mask having the openings as a unit pattern.
Figure 3:
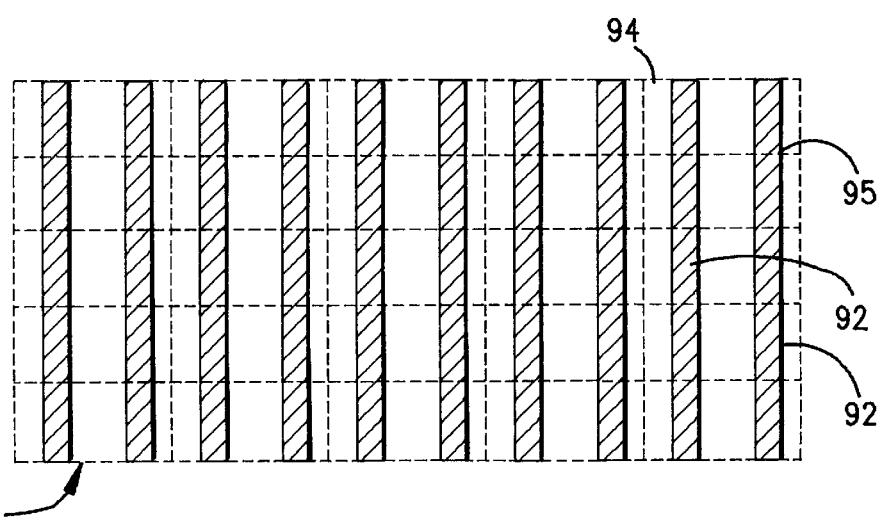
FIG. 3 is a view illustrative of a photo-resist pattern having been obtained by the sequential electron beam exposures carried out with displacements of the mask in lateral and vertical directions A and B.
Figure 4A:
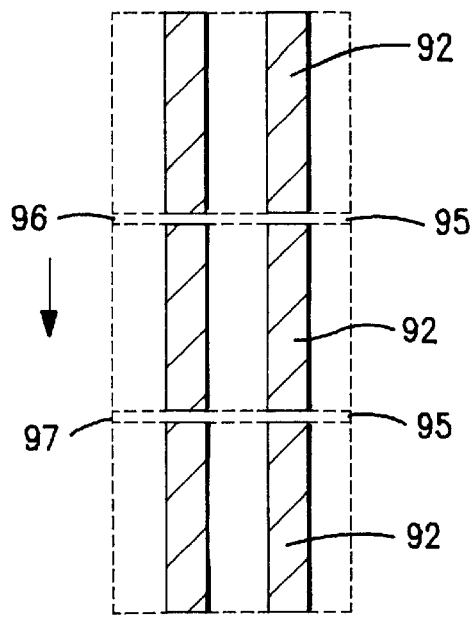
FIGS. 4A and 4B are views illustrative of a displacement of the one-shot electron beam exposure mask in sequential and repeating one-shot electron beam exposures and an influence of the displacement to the patterns having been formed by the mask.
Figure 4B:
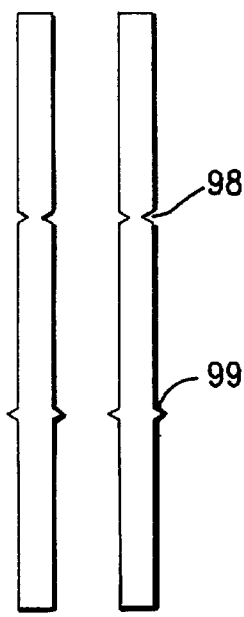
Figure 5:
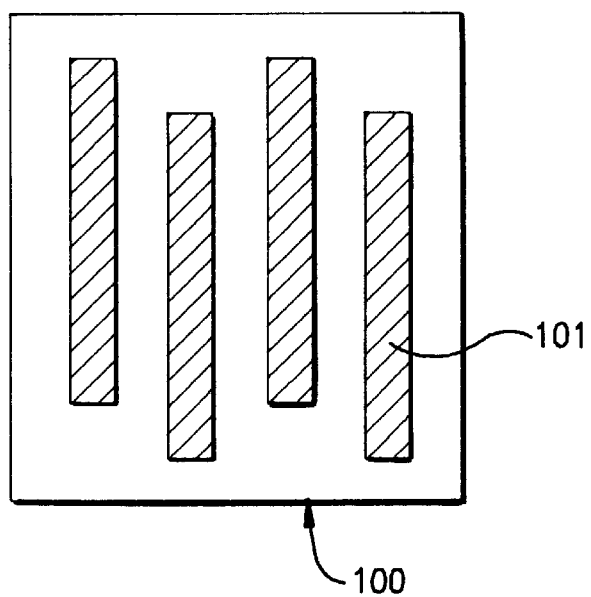
FIG. 5 is illustrative of a partial one-shot electron beam exposure mask for causing the intentional displacement in the vertical direction adjacent two photo-resist patterns relative to each other.
Figure 6:
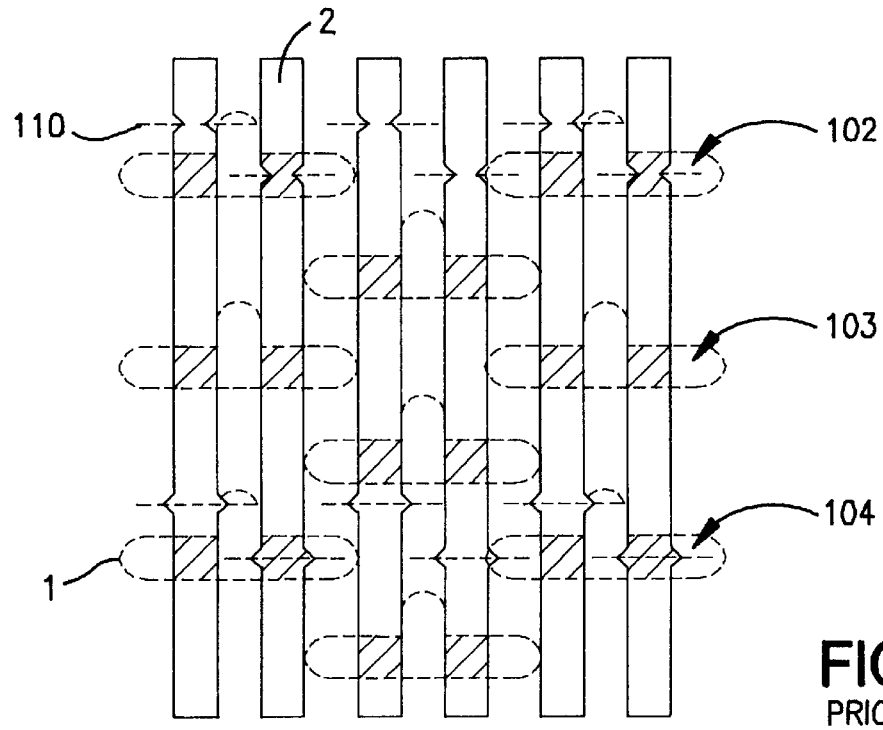
FIG. 6 is a view illustrative of a positional relationship of pinched and expanded portions of word lines prepared by the use of the partial one-shot exposure mask in relation to active regions on which elements are formed.
Figure 7:
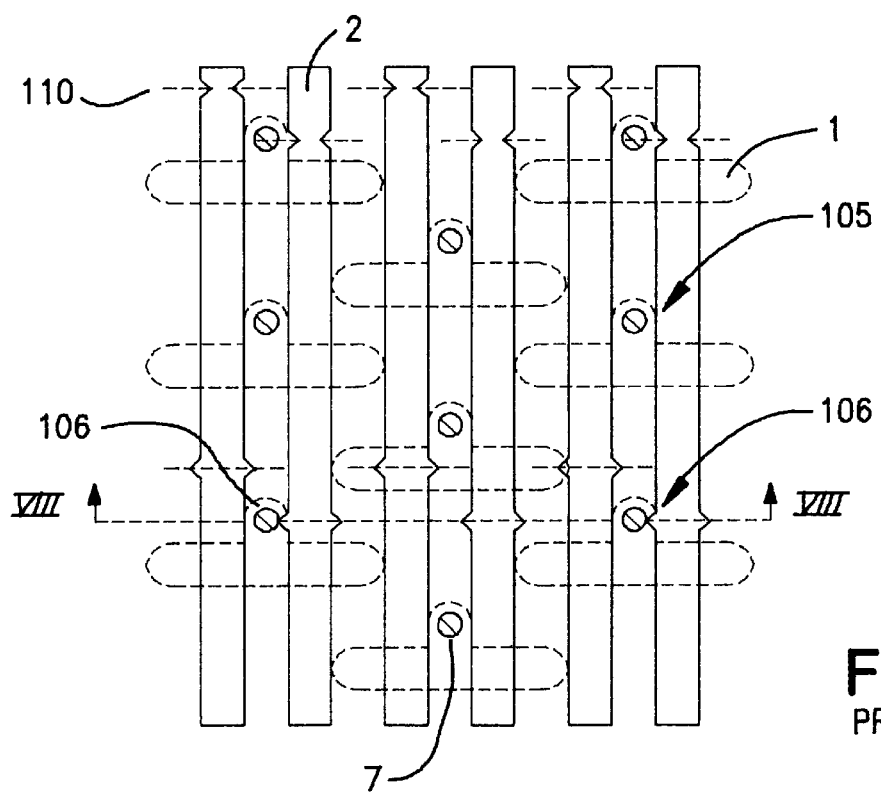
FIG. 7 is a plan view illustrative of a positional relationship between the expanded and pinched portions of the word lines and bit contact holes formed between the word lines.
Figure 8:
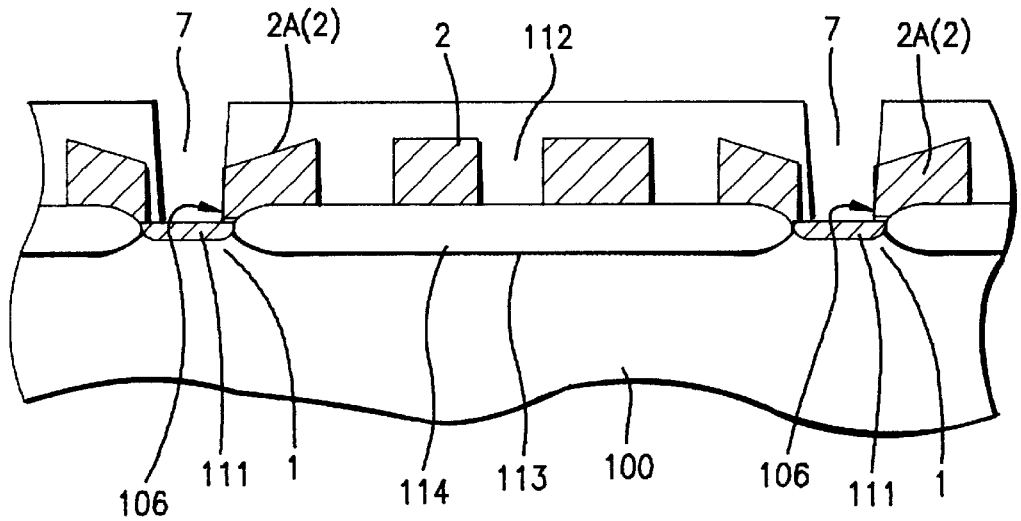
FIG. 8 is a fragmentary cross sectional elevation view illustrative of word lines and bit contact holes taken along an VIII—VIII line of FIG. 7.

In accordance with the present invention, a partial one-shot exposure mask is provided for exposure, by repeating patterns, of a photo-resist formed over active and isolation regions of a semiconductor device, wherein boundaries of patterns of the partial one-shot exposure mask are positioned only in the isolation region. The patterns of the partial one-shot exposure mask may be for formation of word lines. In this case, the boundaries of the patterns of the partial one-shot exposure mask may be formed in a direction perpendicular to a longitudinal direction of the word lines. Alternatively, the boundaries of the patterns of the partial one-shot exposure mask may be formed in a direction parallel to an active region. All of regions for formations of contact holes are included in the active region.

A partial one-shot exposure mask is provided for exposure by repeating patterns, of a photo-resist formed over active and isolation regions of a semi conductor device, wherein boundaries of patterns of the partial one-shot exposure mask are positioned to encompass regions for formation of contact holes.

The novel partial one-shot exposure mask is free of a problem with a gate length variation of a transistor even if a word line is varied in width due to a displacement of the partial one-shot electron beam exposure mask.

The novel partial one-shot exposure mask is free of a problem with a formation of a short circuit between a bit contact and a word line even if a word line is varied in width due to a displacement of the partial one-shot electron beam exposure mask.

In accordance with the present invention, a method of carrying out repeatedly partial one-shot exposures of a semiconductor device having active and isolation regions, wherein if boundaries of a photo-resist pattern comprising repeated unit patterns extend to the active region, then a subsequent partial one-shot exposure is carried out so as to move the boundaries of the photo-resist pattern to the isolation region by keeping the repeated patterns.

In accordance with the present invention, a method of carrying out repeatedly partial one-shot exposures of a semiconductor device having active and isolation regions, wherein if boundaries of a photo-resist pattern comprising repeated unit patterns extend to a contact hole region on which a contact hole will be formed, then a subsequent partial one-shot exposure is carried out so as to move the boundaries of the photo-resist pattern from the contact hole region by keeping the repeated patterns.

The method of carrying out repeatedly partial one-shot exposures is free of a problem with a gate length variation of a transistor even if a word line is varied in width by a displacement of the partial one-shot electron beam exposure mask.

The method of carrying out repeatedly partial one-shot exposures is free of a problem with a formation of a short circuit between a bit contact and a word line even if a word line is varied in width due to a displacement of the partial one-shot electron beam exposure mask.

Figure 9:
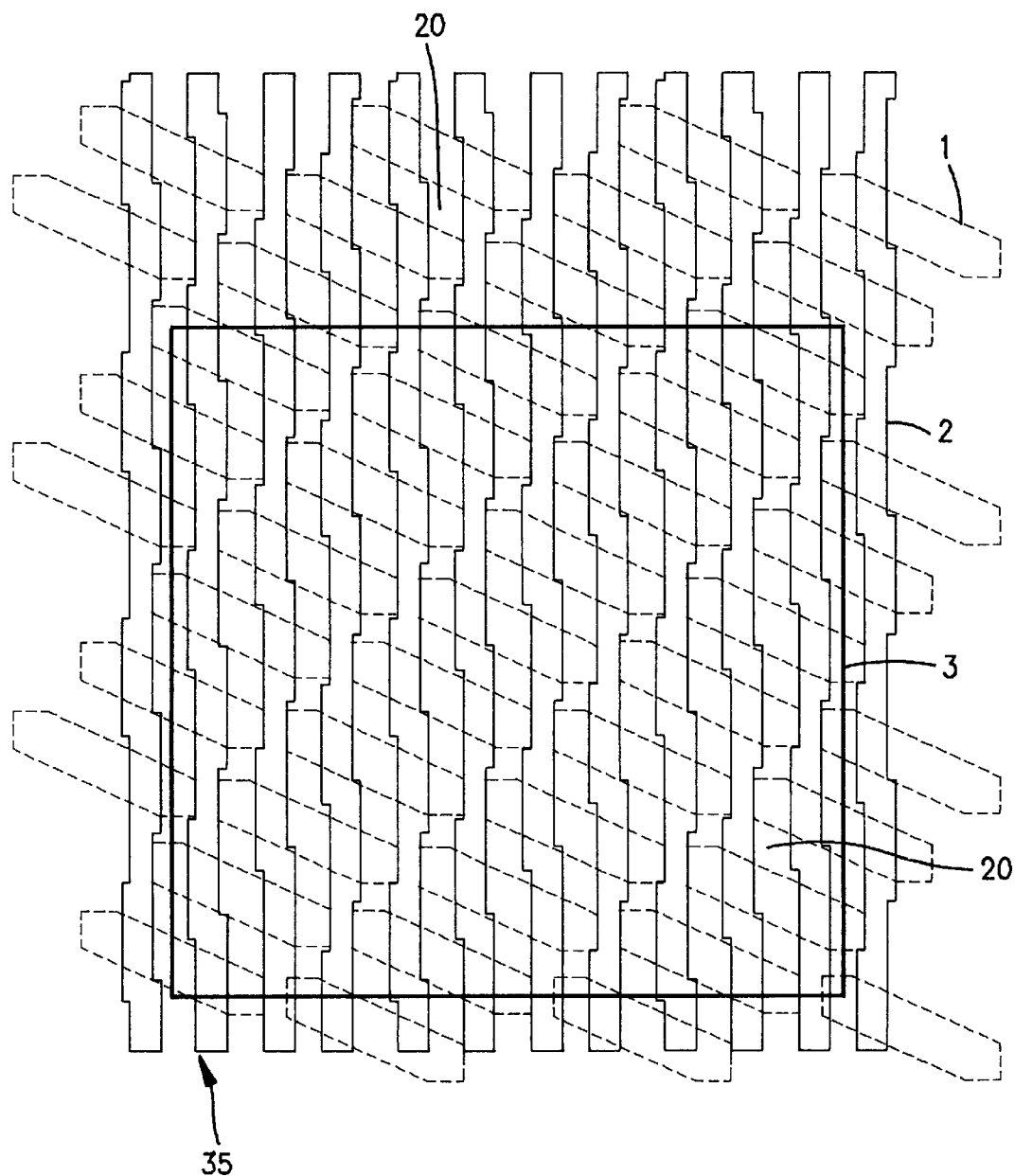
FIG. 9 is a plan view illustrative of a positional relationship between word lines extending over active and isolation regions and a maximum exposure region as well as illustrative of a ¼ pitch cell layout in a first embodiment in accordance with the present invention.

First Embodiment:

A first embodiment according to the present invention will be described in detail with reference to FIGS. 9 through 16. FIG. 9 is a plan view illustrative of a positional relationship between word lines extending over active and isolation regions and a maximum exposure region as well as illustrative of a ¼ pitch cell layout. Word lines 2 extend in parallel to each other and over active regions 1 and isolations regions 20. The active region 1 has a ¼ pitch maximum density filling folded bit line cell layout 35 which is a repeating layout defined by overlapping word lines 2 and also comprises repeating layout units defined by four word lines and four bit lines. The active region 1 is defined and surrounded by the isolation regions 20. A maximum exposure region 3 represents a maximum size of a one-shot exposure using a partial one-shot exposure mask.

Figure 16:
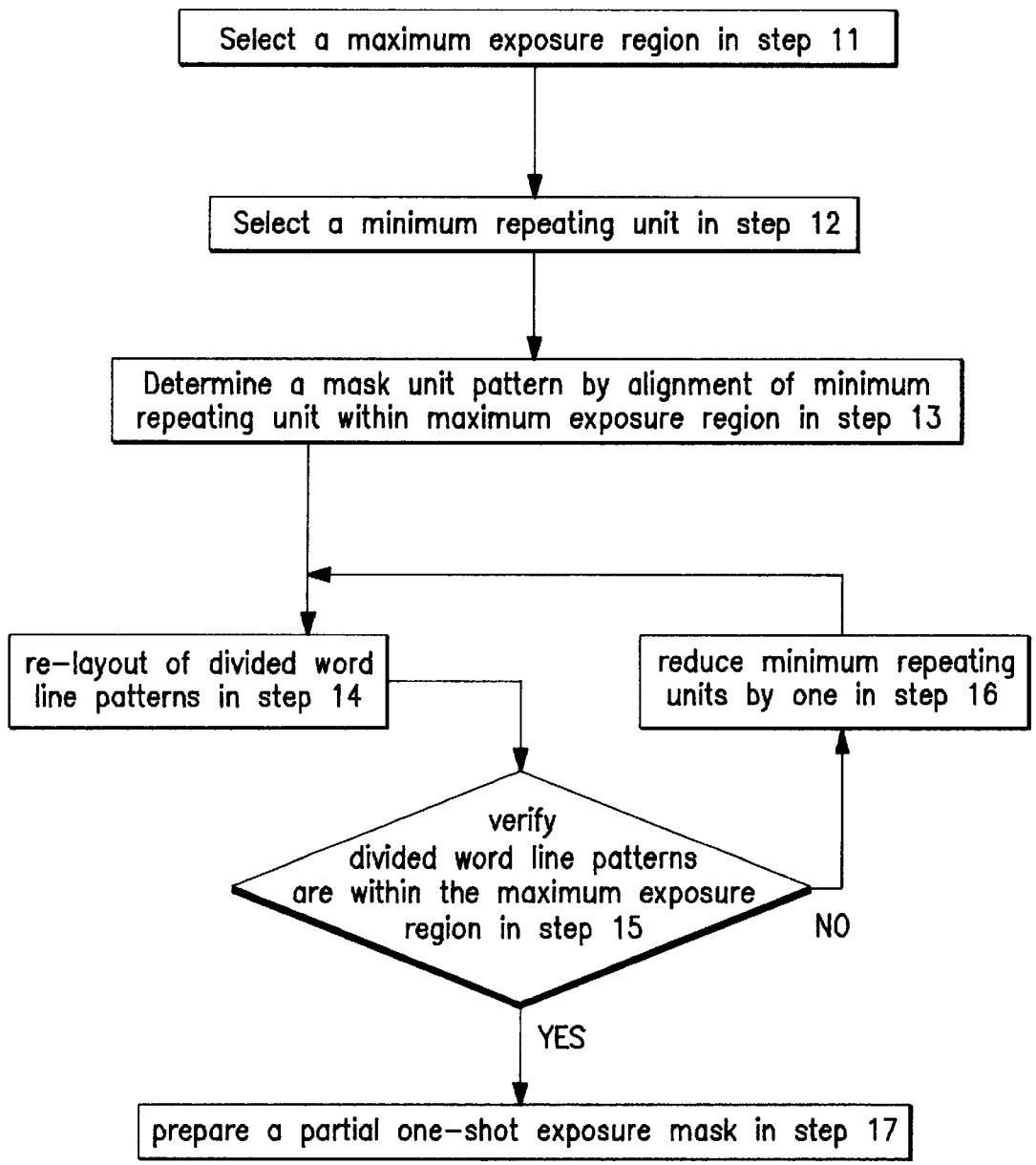
FIG. 16 is a flow chart of showing processes for forming a partial one-shot exposure mask shown in FIG. 14.

With reference to FIG. 16, the maximum exposure region 3 is selected in a step 11.

Figure 10:
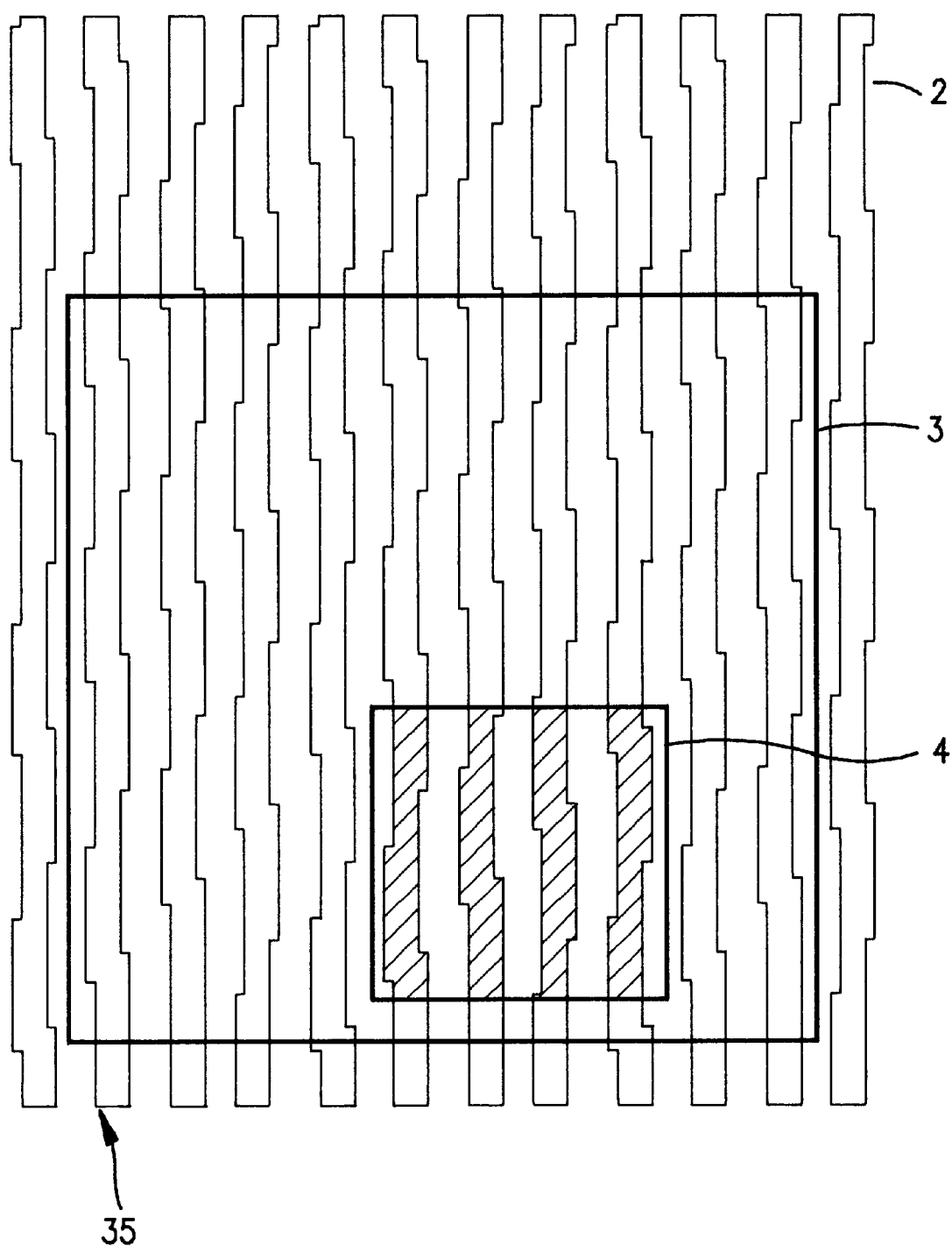
FIG. 10 is a plan view illustrative of a positional relationship between a minimum repeating unit and a maximum exposure region as well as illustrative of a ¼ pitch cell layout in a first embodiment in accordance with the present invention.

FIG. 10 is a plan view illustrative of a positional relationship between a minimum repeating unit and a maximum exposure region as well as illustrative of a ¼ pitch cell layout. A minimum repeating unit 4 is selected which is a layout unit for repeating patterns in a step 12 of FIG. 16. The size of the minimum repeating unit 4 depends upon the cell size and the cell layout.

Figure 11:
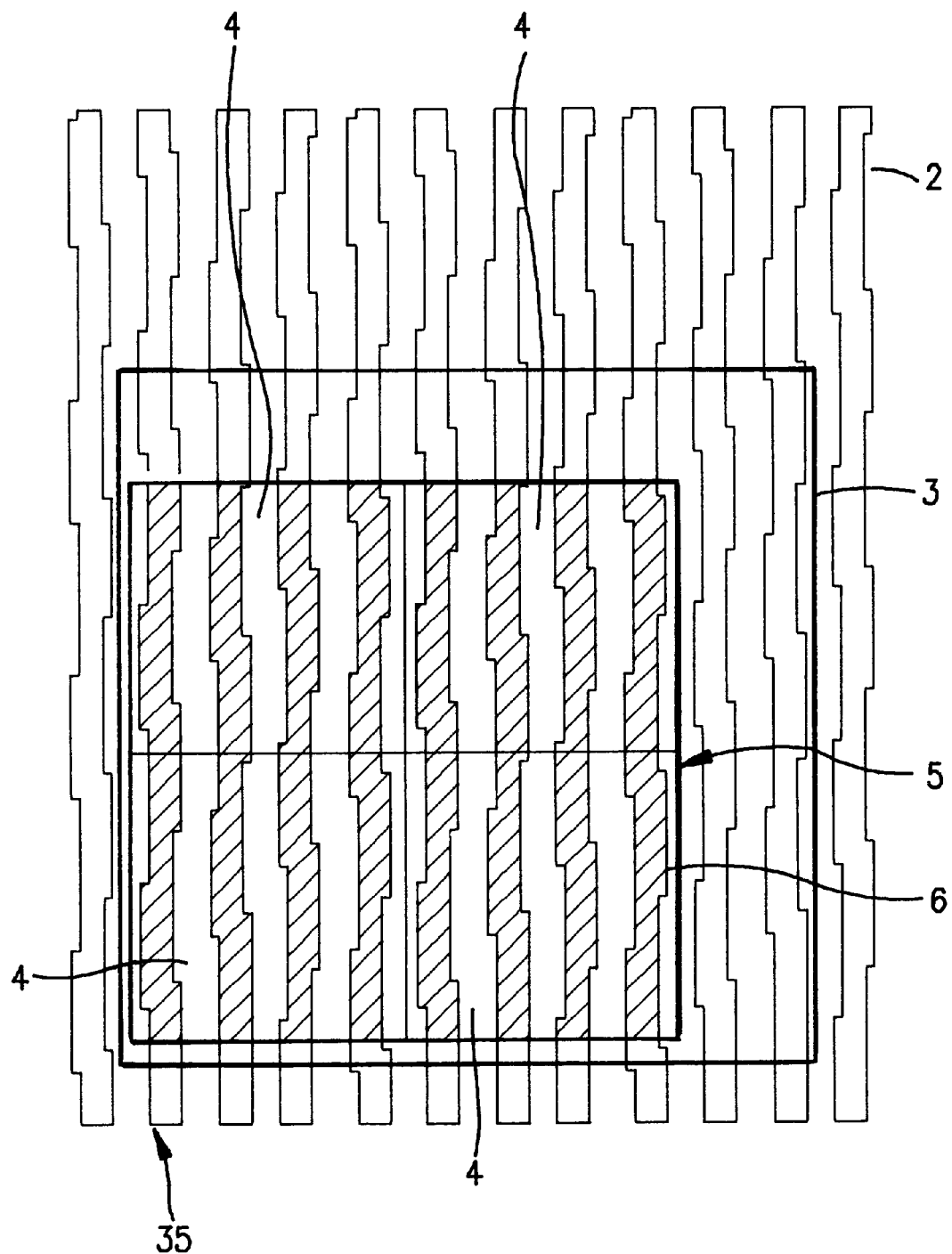
FIG. 11 is a view illustrative of divided word line patterns and repeating units within the maximum exposure region in a bit cell layout in a first embodiment in accordance with the present invention.

FIG. 11 is a view illustrative of divided word line patterns and repeating units within the maximum exposure region in a bit cell layout. Four of the minimum repeating units 4 are aligned in matrix within the maximum exposure region 3. The number of the minimum repeating units 4 which may be aligned in matrix within the maximum exposure region 3 depend upon a ratio in area of the minimum repeating unit 4 to the maximum exposure region 3. Considering that the maximum exposure region has a constant area, an alignment in matrix of the four minimum repeating units 4 is a repeating exposure pitch 5. Namely, a mask unit pattern 5 is determined by alignment in matrix of minimum repeating units within the maximum exposure region. Divided word patterns 6 are defined within the mask unit pattern 5.

Figure 12:
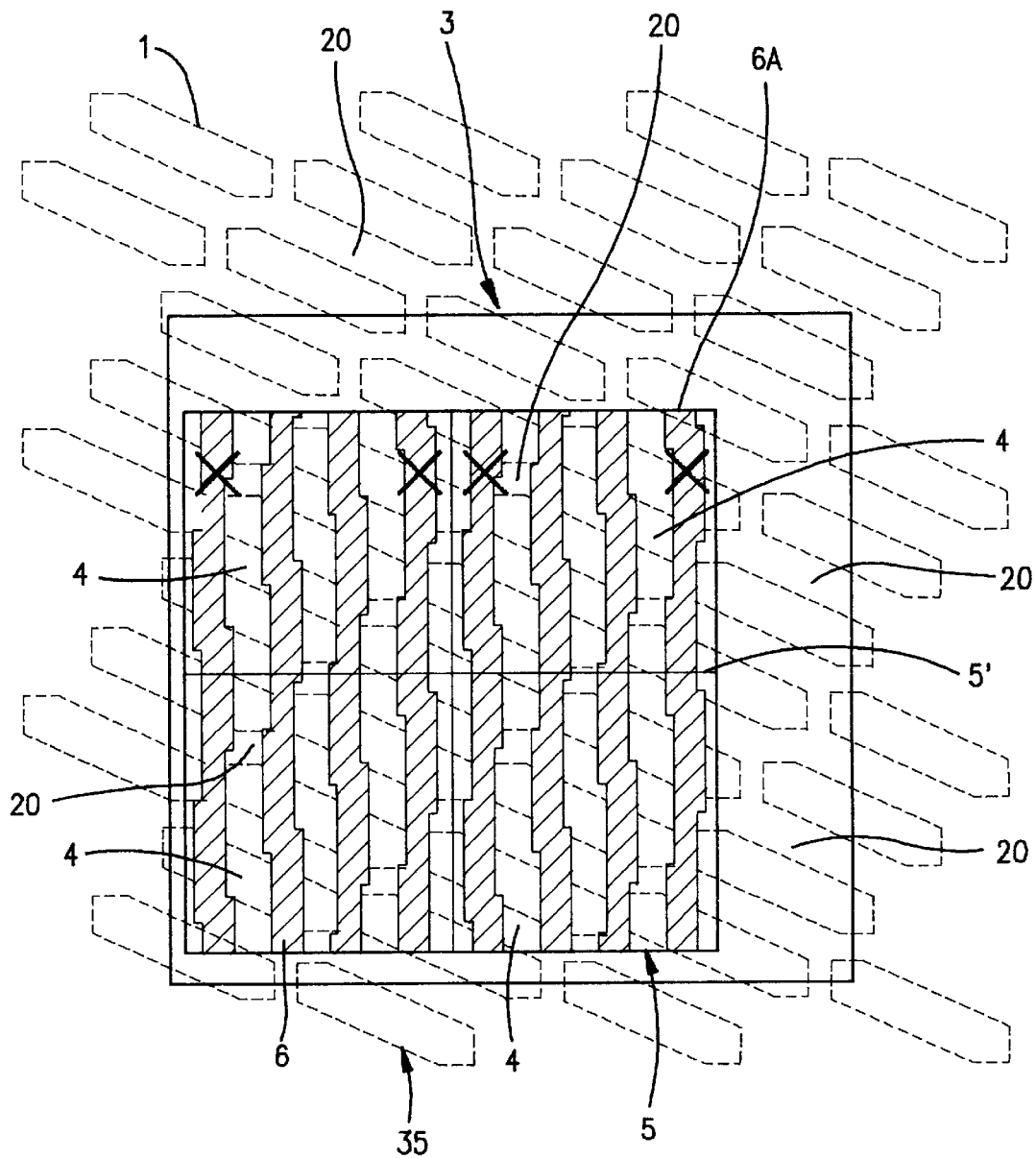
FIG. 12 is a view illustrative of a relationship between the active regions and the repeating exposure pitch frame in a first embodiment in accordance with the present invention.

FIG. 12 is a view illustrative of a relationship between the active regions and the repeating exposure pitch frame. The divided word line patterns 6 are superimposed over the active regions 1. Eight of the divided word line patterns 6 are within the exposure pitch frame 5'. Four of the divided word line patterns 6 marked by "X" have ends which are located over the active regions 1.

Figure 13:
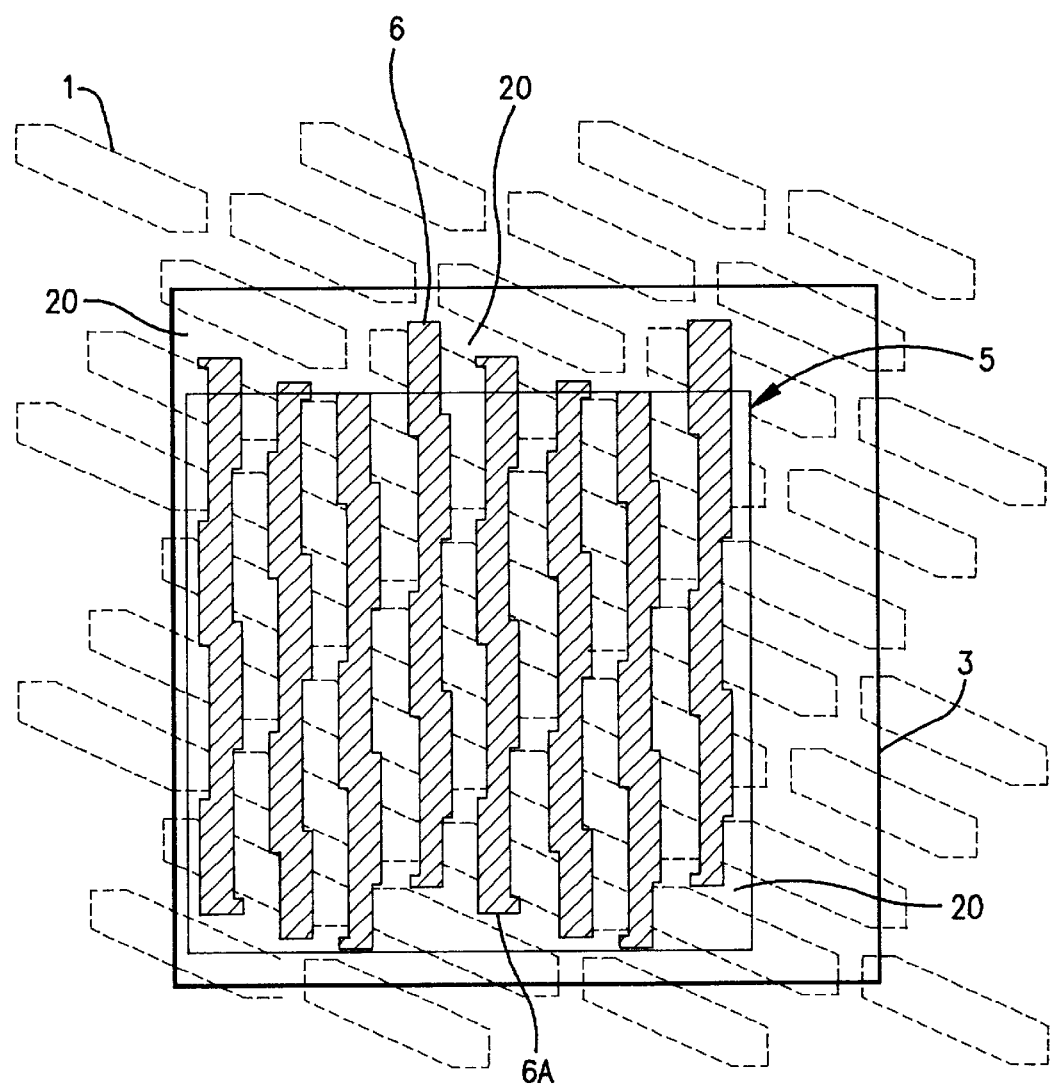
FIG. 13 is a view illustrative of re-layout of the divided word line patterns so that the ends of the four of the divided word line patterns marked by "X" are located in the isolation regions in a first embodiment in accordance with the present invention.

FIG. 13 is a view illustrative of re-layout of the divided word lines patterns so that the ends of the four of the divided word line patterns marked by "X" are located in the isolation regions. The re-layout of the divided word line patterns 6 are carried out so that the ends of the four of the divided word line patterns 6 marked by "X" are moved from the active regions 1 to the isolation regions 20 whereby no ends of the eight divided word line patterns 6 are located in the active regions 1 in a step 14 of FIG. 16.

In FIG. 13, all of the divided word line patterns 6 having been moved are located within the maximum exposure region 3. If, however, any of the divided word line pattern 6 having been moved extend beyond the maximum exposure region 3, then it is required to verify whether or not the all of the divided word line pattern 6 having been moved are located within the maximum exposure region 3 in a step 15 of FIG. 15. If all of the divided word line patterns 6 having been moved are located within the maximum exposure region 3, then a partial one-shot exposure mask is prepared in a step 17. If, however, any of the divided word line patterns 6 having been moved extend beyond the maximum exposure region 3, then the minimum repeating units aligned in the longitudinal direction of the word lines are reduced by one in a step 16 of FIG. 16. Then, the process is back to the step 14 wherein the re-layout of the divided word line patterns 6 are again carried out so that the ends of the four of the divided word line patterns 6 marked by "X" are moved from the active regions 1 to the isolation regions 20 whereby no ends of the eight divided word line patterns 6 are located in the active regions 1.

Figure 14:
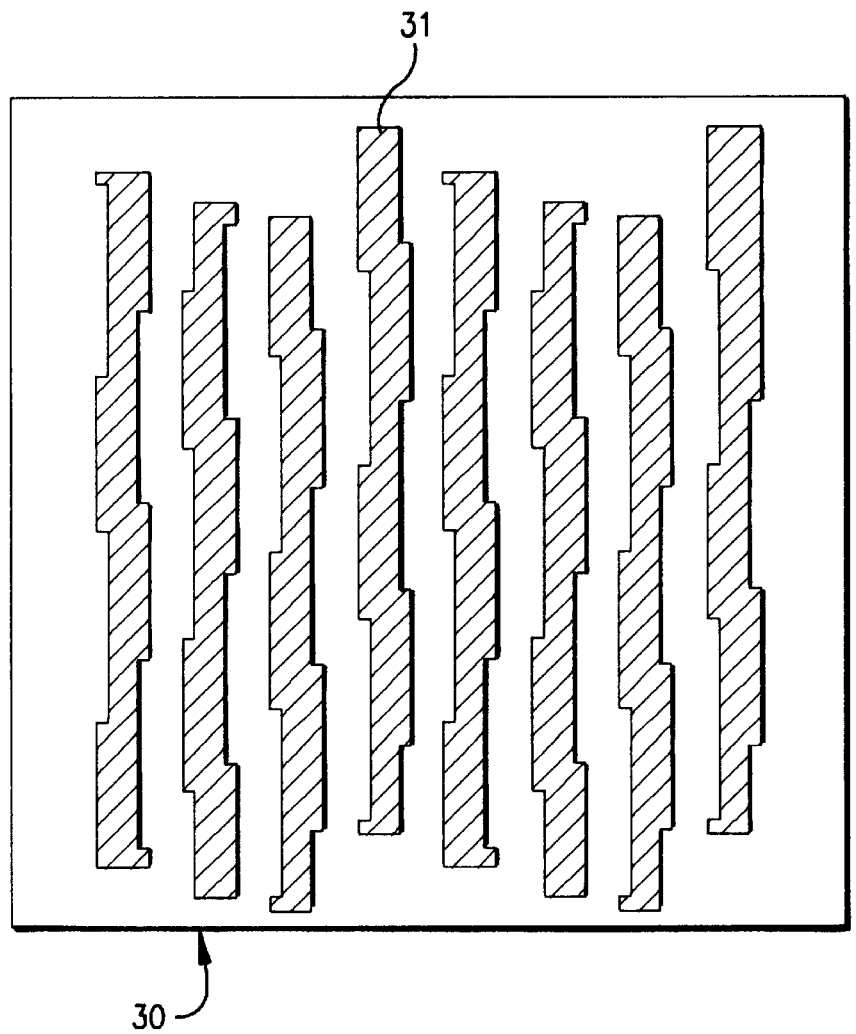
FIG. 14 is a view illustrative of a partial one-shot exposure mask having divided word line patterns having ends which are located in the isolation regions in a first embodiment in accordance with the present invention.

FIG. 14 is a view illustrative of a partial one-shot exposure mask having divided word line patterns having ends which are located in the isolation regions. FIG. 16 is a flow chart of showing processes for forming a partial one-shot exposure mask shown in FIG. 14. The partial one-shot exposure mask 30 is prepared in a method of FIG. 16 and has divided word line patterns 31 having ends which are located in the isolation regions.

Whereas, in FIG. 13, the end portions 6A of the divided word line patterns 6 are located at a center portion of the isolation regions 20 between the active regions 1, there is no problem unless the end portions 6A of the divided word line patterns 6 are located over the active regions 1. It is, for example, possible that the divided word line patterns 6 have end portions which are bounded in a direction parallel to the longitudinal direction of the active regions 1.

Figure 15A:
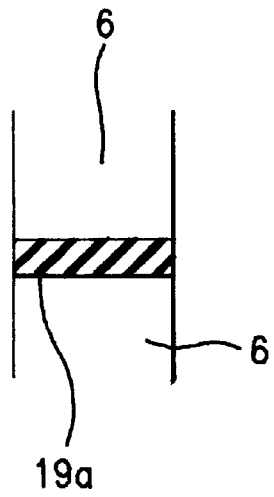
FIG. 15A is a view illustrative of a simple shape of the end portions wherein divided word line patterns 6 simply overlap each other and a boundary of the end portion of the divided word line patterns 6 is perpendicular to the longitudinal direction of the divided word line patterns 6 to form a simple rectangular-shaped overlap portion 19a in a first embodiment in accordance with the present invention.
Figure 15B:
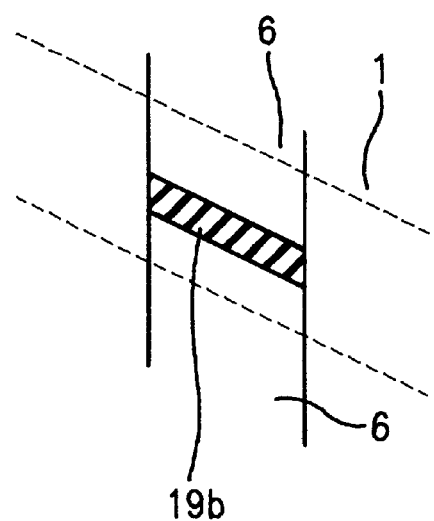
FIG. 15B is a view illustrative of a modified shape of the end portions wherein divided word line patterns 6 overlap each other and a boundary of the end portion of the divided word line pattern 6 is oblique to the longitudinal direction of the divided word line patterns 6 but parallel to the longitudinal direction of the active region 1 to form a modified rectangular-shaped overlap portion 19b in a first embodiment in accordance with the present invention.
Figure 15C:
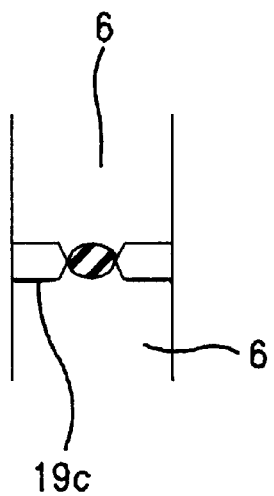
FIG. 15C is a view illustrative of a convex shape of the end portions wherein divided word line patterns 6 overlap each other via convex portions 19c and the end portion of the divided word line patterns 6 has a convex rectangular-shaped and having a boundary which is perpendicular to the longitudinal direction of the divided word line patterns 6 in a first embodiment in accordance with the present invention.
Figure 15D:
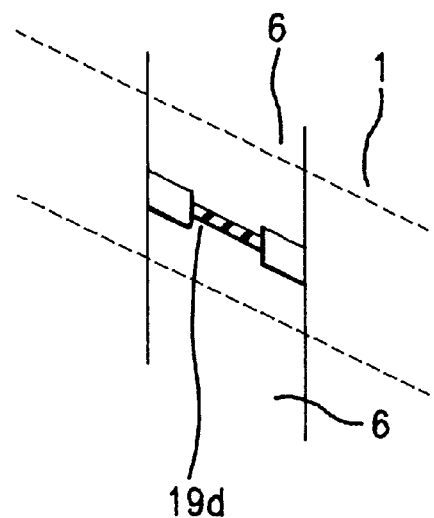
FIG. 15D is a view illustrative of a modified convex shape of the end portions wherein divided word line patterns 6 each overlap each other via modified convex portions 19d and the end portion of the divided word line patterns 6 has a modified convex rectangular-shaped but having a boundary which is oblique to the longitudinal direction of the divided word line patterns 7 but parallel to the longitudinal direction of the active region 1 in a first embodiment in accordance with the present invention.

Further, various modification in shape of the end portions of the divided word line patterns of the partial one-shot exposure mask are possible. FIG. 15A is a view illustrative of a simple shape of the end portions wherein divided word line patterns 6 are simply overlapped to each other and a boundary of the end portion of the divided word line patterns 6 is perpendicular to the longitudinal direction of the divided word line patterns 6 to form a simple rectangular-shaped overlap portion 19a. FIG. 15B is a view illustrative of a modified shaped of the end portions wherein divided word line pattern 6 overlap each other and a boundary of the end portion of the divided word line pattern 6 is oblique to the longitudinal direction of the divided word line patterns 6 but parallel to the longitudinal direction of the active region 1 to form a modified rectangular-shaped overlap portion 19b. FIG. 15C is a view illustrative of a convex shape of the end portions wherein divided word line patterns 6 overlap each other via convex portions 19c and the end portion of the divided word line patterns 6 has a convex projection on a rectangular shaped end that has a boundary which is perpendicular to the longitudinal direction of the divided word line patterns 6. FIG. 15D is a view illustrative of a modified convex shape of the end portions wherein divided word line patterns 6 overlap each other via modified convex portions 19d and the end portion of the divided word line patterns 6 has a modified projection on a convex rectangular-shaped end that has a boundary which is oblique to the longitudinal direction of the divided word line patterns 6 but parallel to the longitudinal direction of the active region 1.

Figure 17:
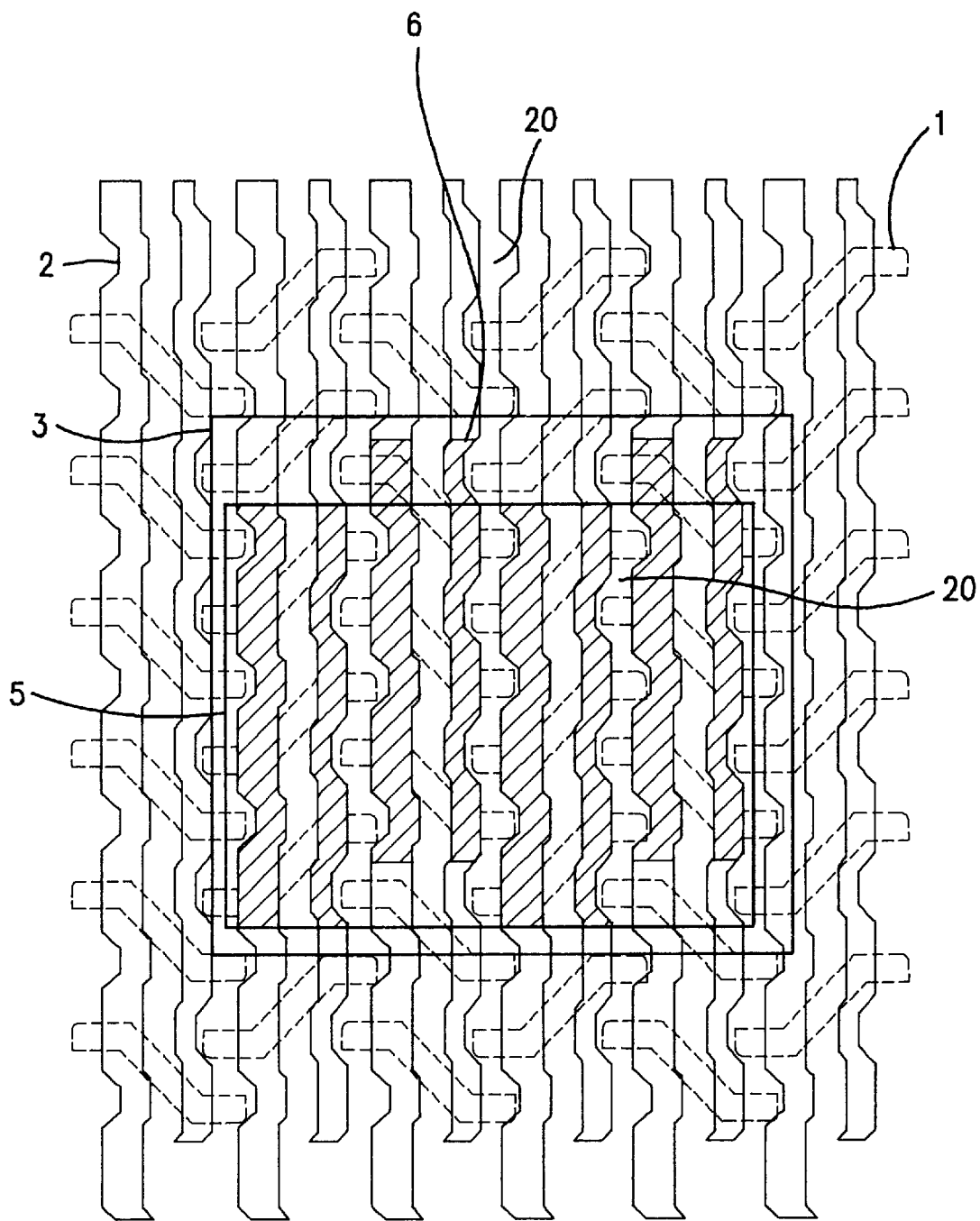
FIG. 17 is a view illustrative of divided word line patterns and repeating units within the maximum exposure region in a bit cell layout in a second embodiment in accordance with the present invention.

Second Embodiment:

A second embodiment according to the present invention will be described in detail with reference to FIGS. 17 and 18. FIG. 17 is a view illustrative of divided word line patterns and repeating units within the maximum exposure region in a bit cell layout in a second embodiment in accordance with the present invention. In this embodiment, the active region 1 has two parallel end portions connected by an oblique portion and is different from that of the first embodiment. The present invention can be applied to the ½ pitch cell layout which comprises repeating units, each of which is defined by four word lines and two bit lines. The repeating exposure pitch 6 comprises six minimum repeating units.

Figure 18:
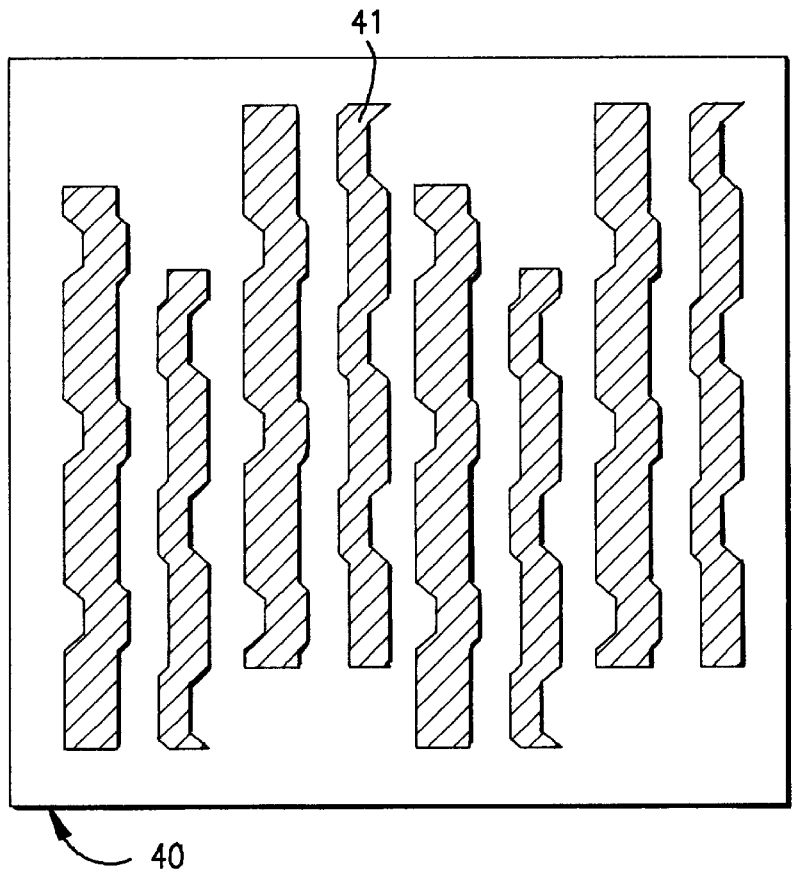
FIG. 18 is a view illustrative of a partial one-shot exposure mask having divided word line patterns having ends which are located in the isolation regions in a second embodiment in accordance with the present invention.

FIG. 18 is a view illustrative of a partial one-shot exposure mask 40 having divided word line patterns 41 having ends which are located in the isolation regions.

Any other structure, shape of the mask and processes of forming the mask are the same as in the first embodiment, for which reason the descriptions will be omitted.

Figure 19:
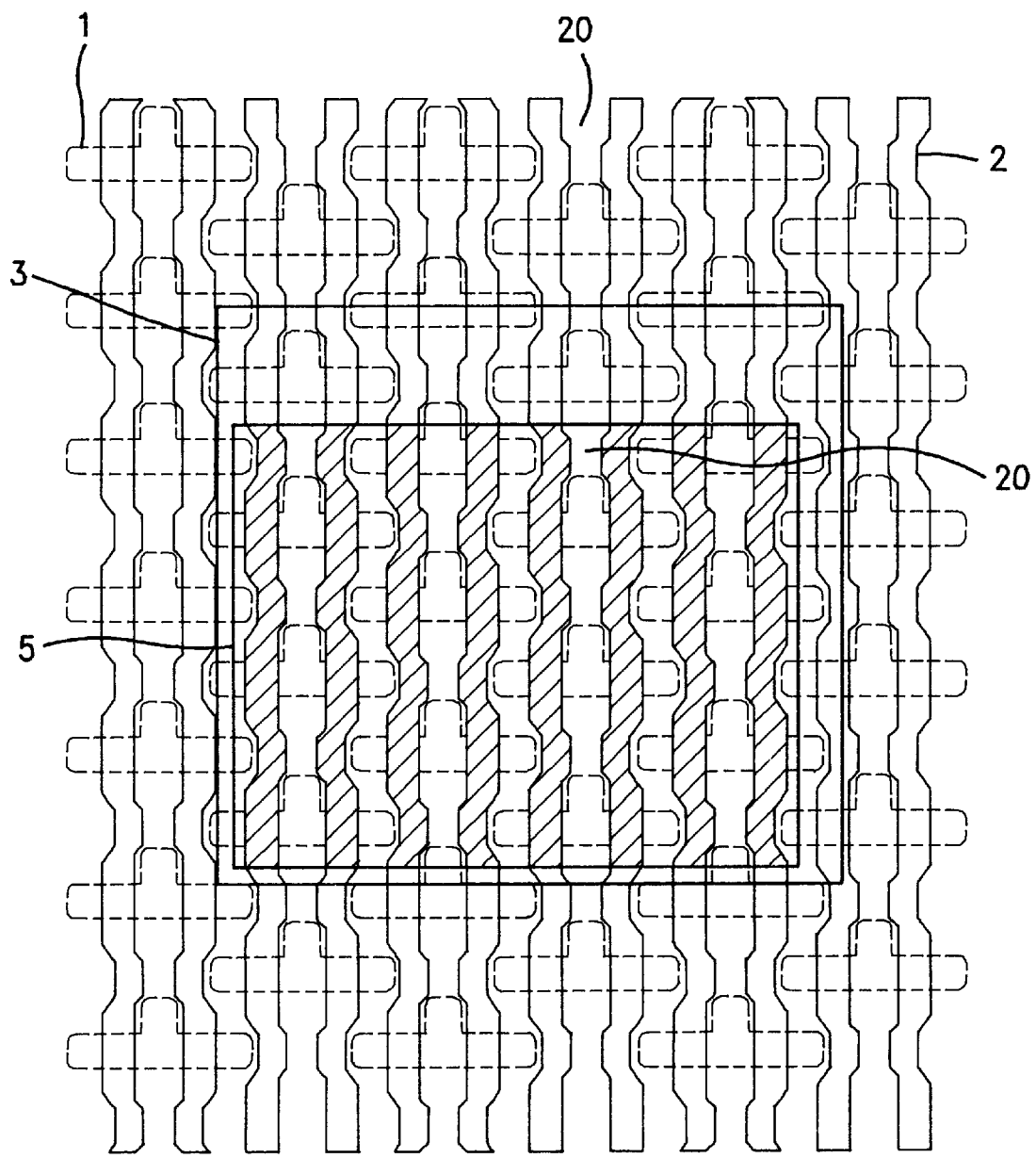
FIG. 19 is a view illustrative of divided word line patterns and repeating units within the maximum exposure region in a bit cell layout in a third embodiment in accordance with the present invention.

Third Embodiment:

A third embodiment according to the present invention will be described in detail with reference to FIGS. 19 through 20. FIG. 19 is a view illustrative of divided word line patterns and repeating units within the maximum exposure region in a bit cell layout in a third embodiment in accordance with the present invention. The third embodiment is different only in the active region patterns from the second embodiment. The following descriptions will focus on the difference between them. The active region 1 has a modified rectangular base portion with a convex portion extending from a center of the rectangular base portion. The repeating exposure pitch 5 comprises six minimum repeating units. If the end portions of the divided word line patterns 6 are placed on the isolation regions 20, then the divided word line patterns are within the maximum exposure region 3.

Figure 20:
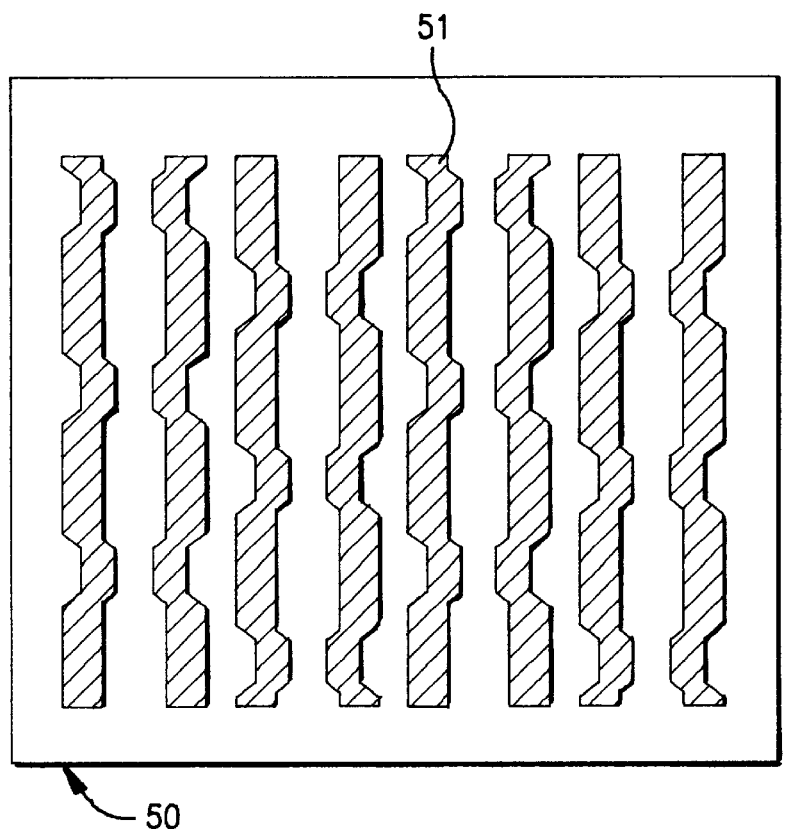
FIG. 20 is a view illustrative of a partial one-shot exposure mask having divided word line patterns having ends which are located in the isolation regions in a third embodiment in accordance with the present invention.

FIG. 20 is a view illustrative of a partial one-shot exposure mask 50 having divided word line patterns 51 having ends which are located in the isolation regions.

Any other structure, shape of the mask and processes of forming the mask are the same as the second embodiment, for which reason the descriptions will be omitted.

Figure 21:
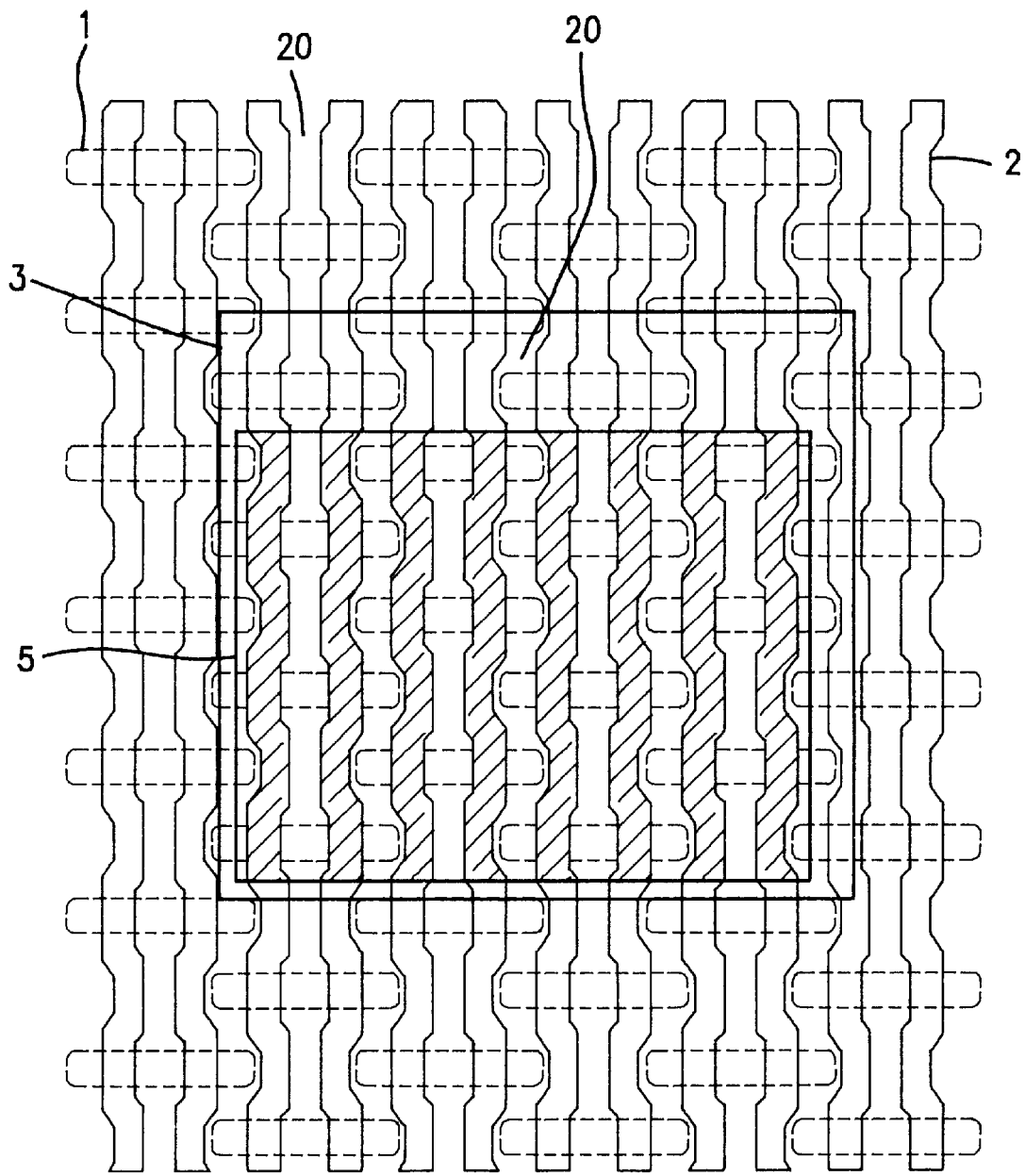
FIG. 21 is a view illustrative of divided word line patterns and repeating units within the maximum exposure region in a bit cell layout in a fourth embodiment in accordance with the present invention.

Fourth Embodiment:

A fourth embodiment according to the present invention will be described in detail with reference to FIGS. 21 through 22. FIG. 21 is a view illustrative of divided word line patterns and repeating units within the maximum exposure region in a bit cell layout in a fourth embodiment in accordance with the present invention. The fourth embodiment is different only in the active region patterns from the third embodiment. The following descriptions will focus on the difference between them. The active region 1 is rectangular. If the end portions of the divided word line patterns are placed on the isolation regions 20, then the divided word line patterns are within the maximum exposure region 3.

Figure 22:
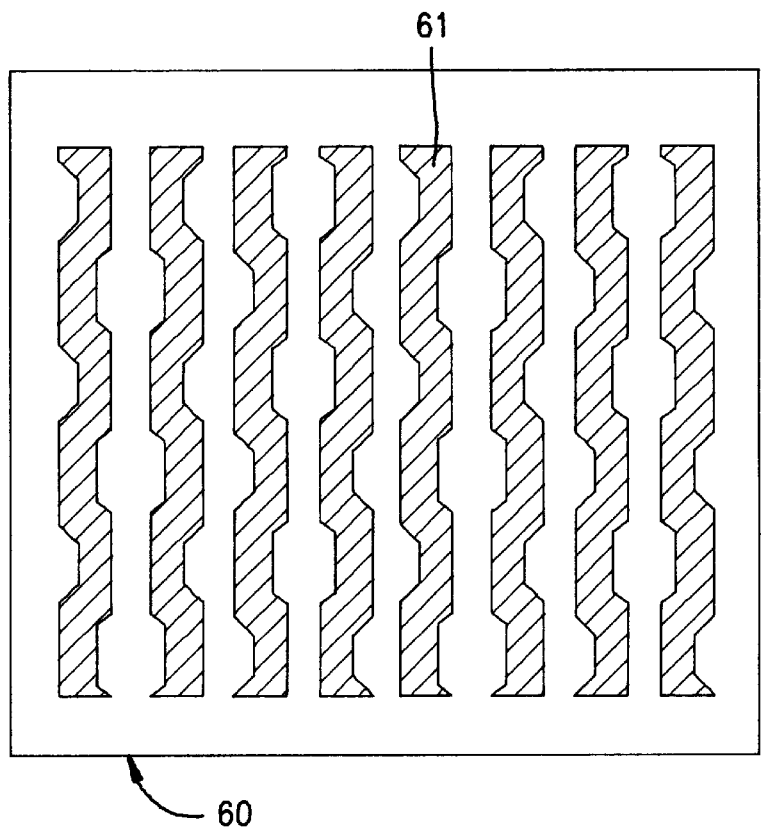
FIG. 22 is a view illustrative of a partial one-shot exposure mask having divided word line patterns having ends which are located in the isolation regions in a fourth embodiment in accordance with the present invention.

FIG. 22 is a view illustrative of a partial one-shot exposure mask 60 having divided word line patterns 61 having ends which are located in the isolation regions.

Any other structure, shape of the mask and processes of forming the mask are the same as in the second embodiment, for which reason the descriptions will be omitted.

Figure 23:
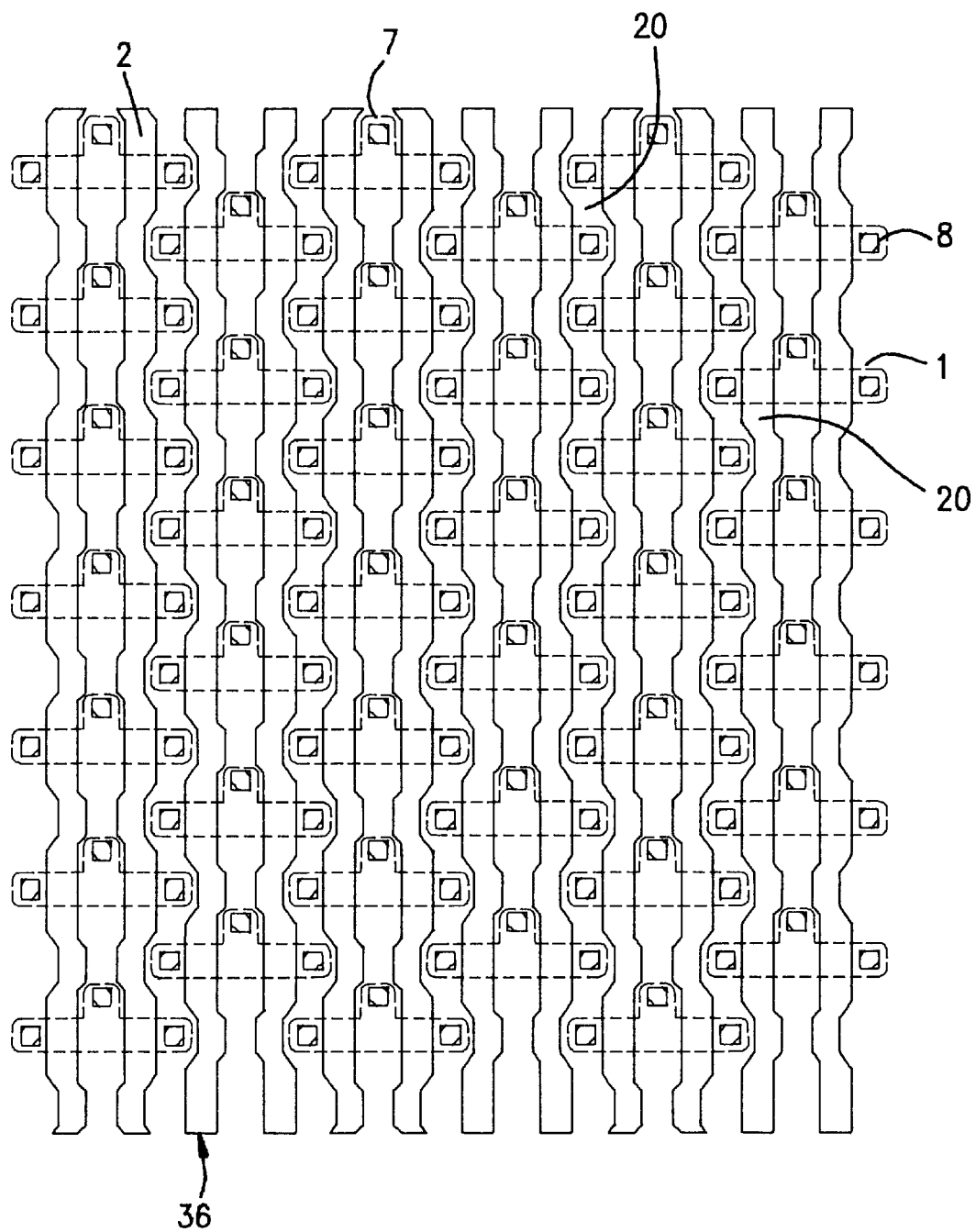
FIG. 23 is a plan view illustrative of a positional relationship between word lines extending over active and isolation regions and capacitor and bit contact portions in a fifth embodiment in accordance with the present invention.

Fifth Embodiment:

A fifth embodiment according to the present invention will be described in detail with reference to FIGS. 23 through 30. FIG. 23 is a plan view illustrative of a positional relationship between word lines 2 extending over active and isolation regions 1 and 20 and capacitor and bit contact portions 8 and 7 in a ½ pitch cell layout 36.

Figure 24:
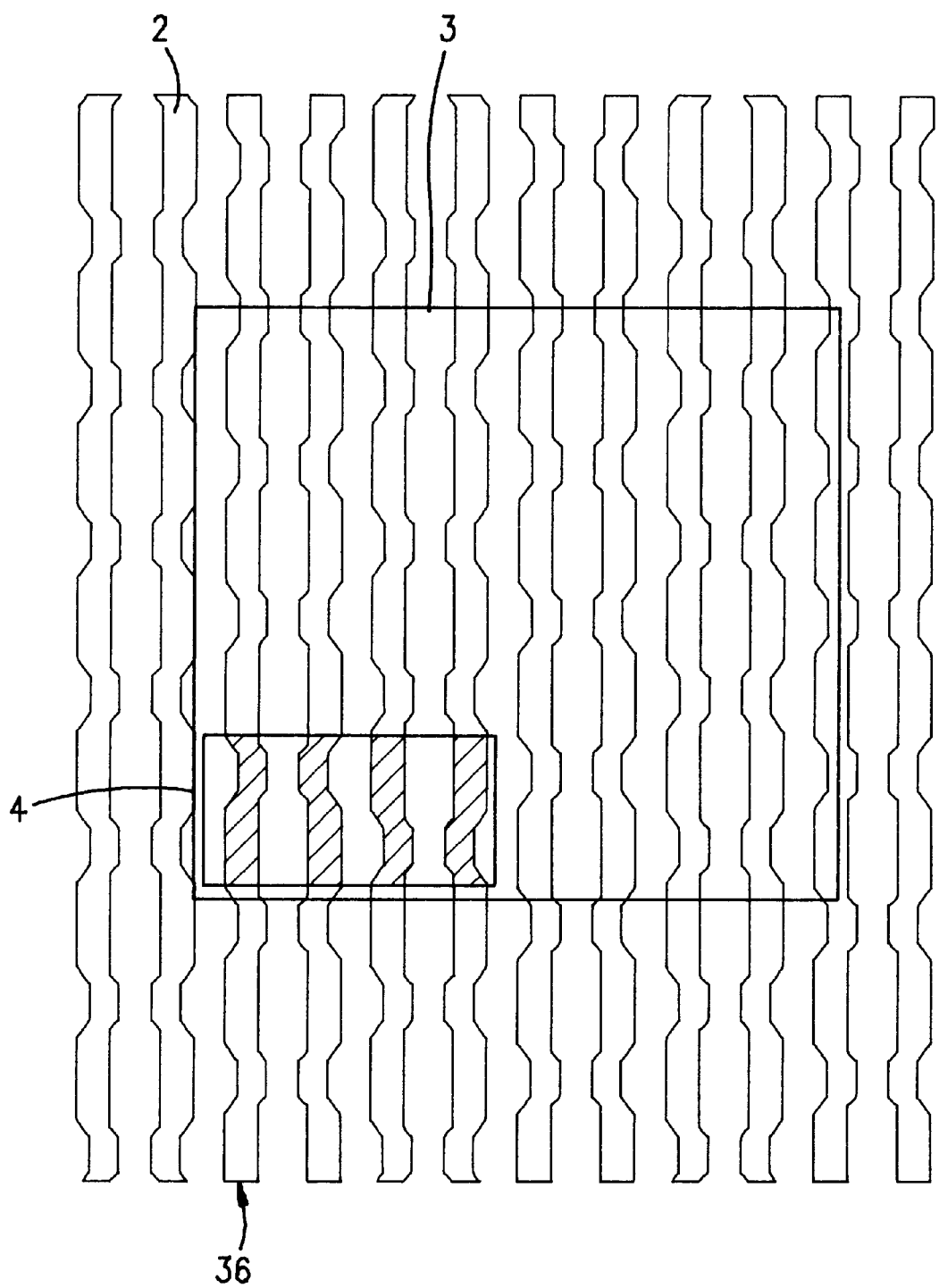
FIG. 24 is a plan view illustrative of a positional relationship between a minimum repeating unit and a maximum exposure region as well as illustrative of a ½ pitch cell layout in a fifth embodiment in accordance with the present invention.

FIG. 24 is a plan view illustrative of a positional relationship between a minimum repeating unit 4 and a maximum exposure region 3 as well as illustrative of a ½ pitch cell layout. The maximum exposure region 3 is defined in a step 21 of FIG. 30 and subsequently the minimum repeating units are selected in a step 22 of FIG. 30.

Figure 25:
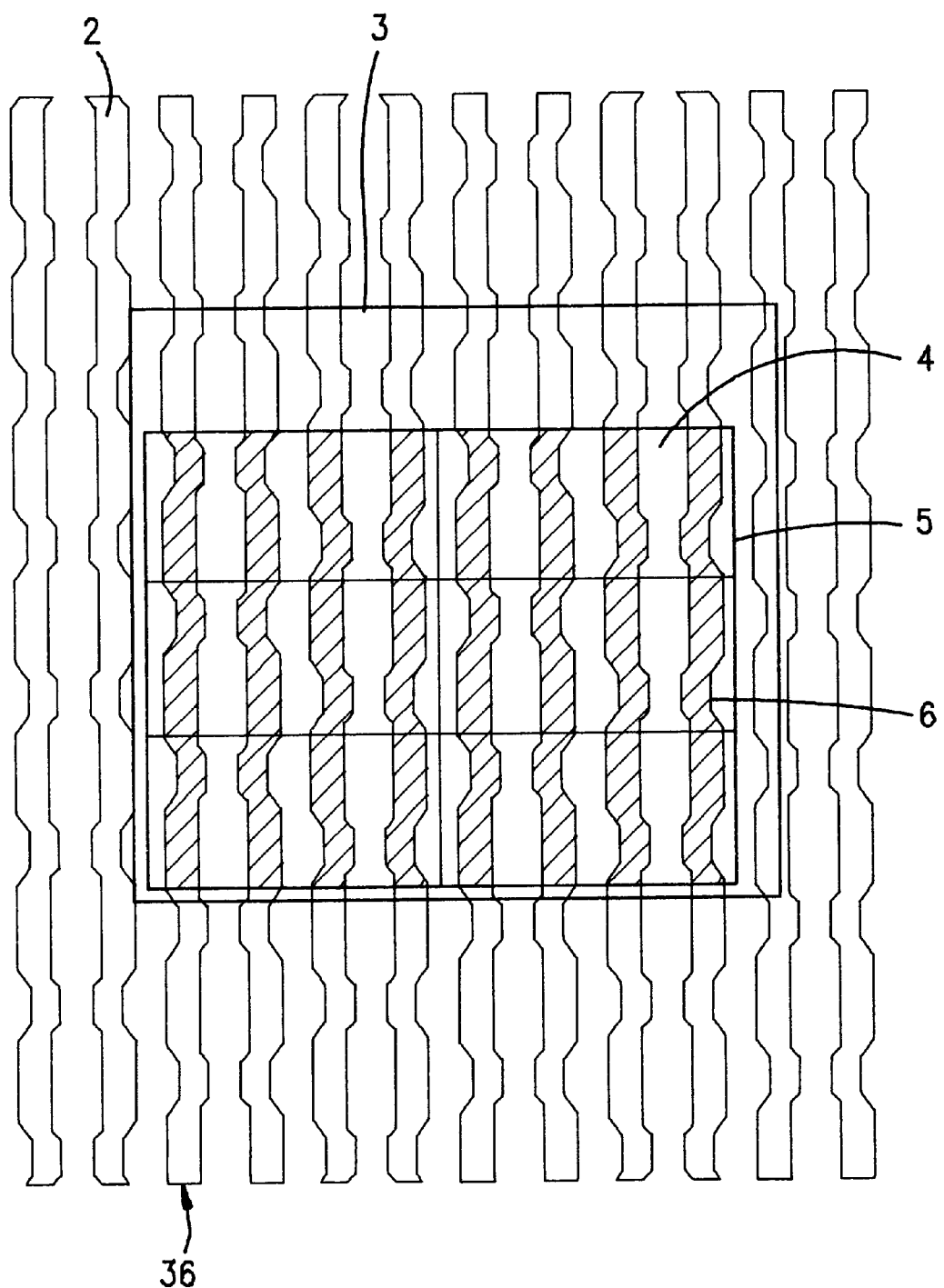
FIG. 25 is a view illustrative of divided word line patterns and repeating units within the maximum exposure region in a bit cell layout in a fifth embodiment in accordance with the present invention.
Figure 30:
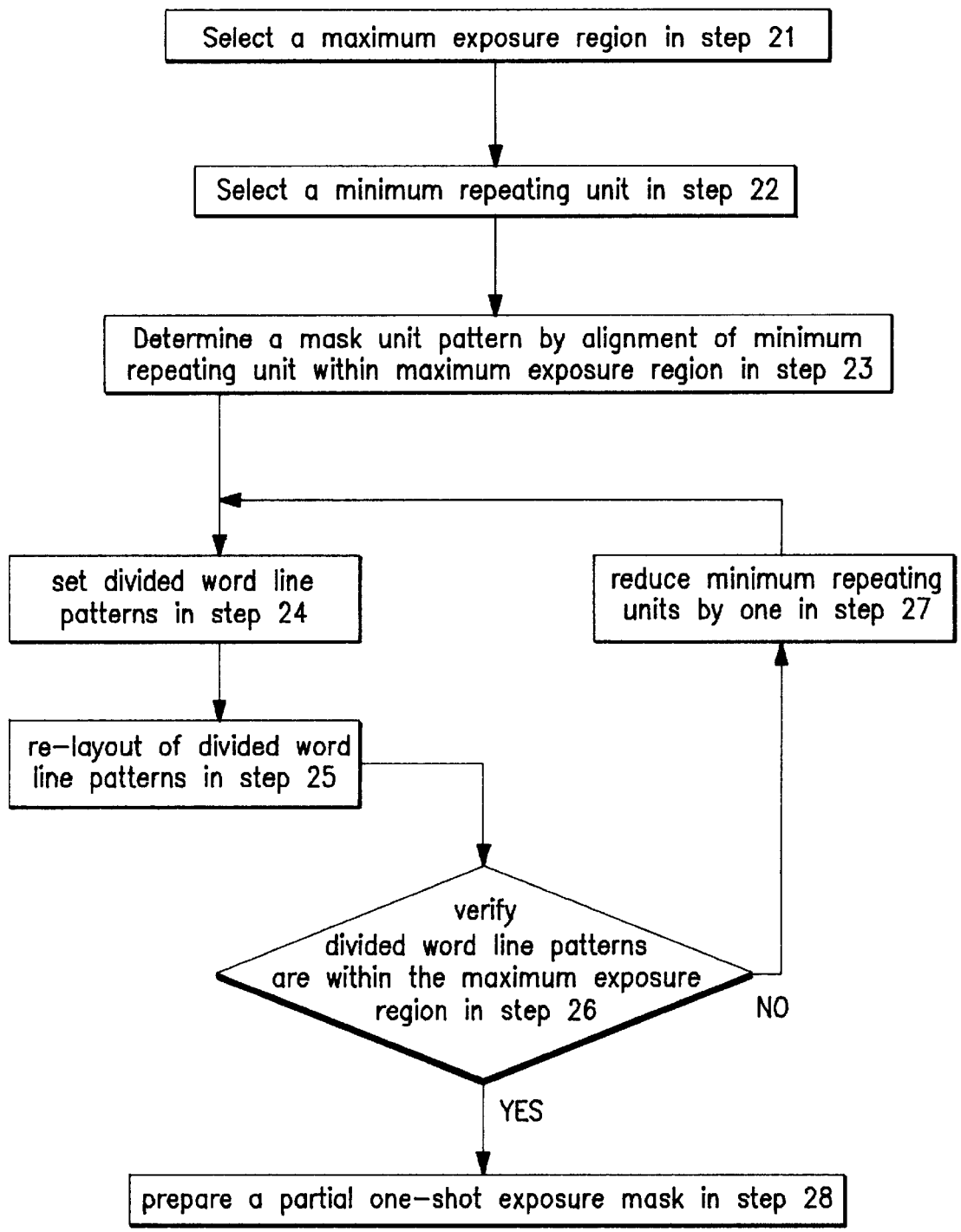
FIG. 30 is a flow chart of showing processes for forming a partial one-shot exposure mask shown in FIG. 28 in a fifth embodiment in accordance with the present invention.

FIG. 25 is a view illustrative of divided word line patterns 6 and repeating exposure pitch 5 within the maximum exposure region 3 in a bit cell layout, wherein the minimum repeating unit 4 are aligned within the maximum exposure region 3 for determination of the unit patterns and divided word line patterns in steps 23 and 24 of FIG. 30.

Figure 26:
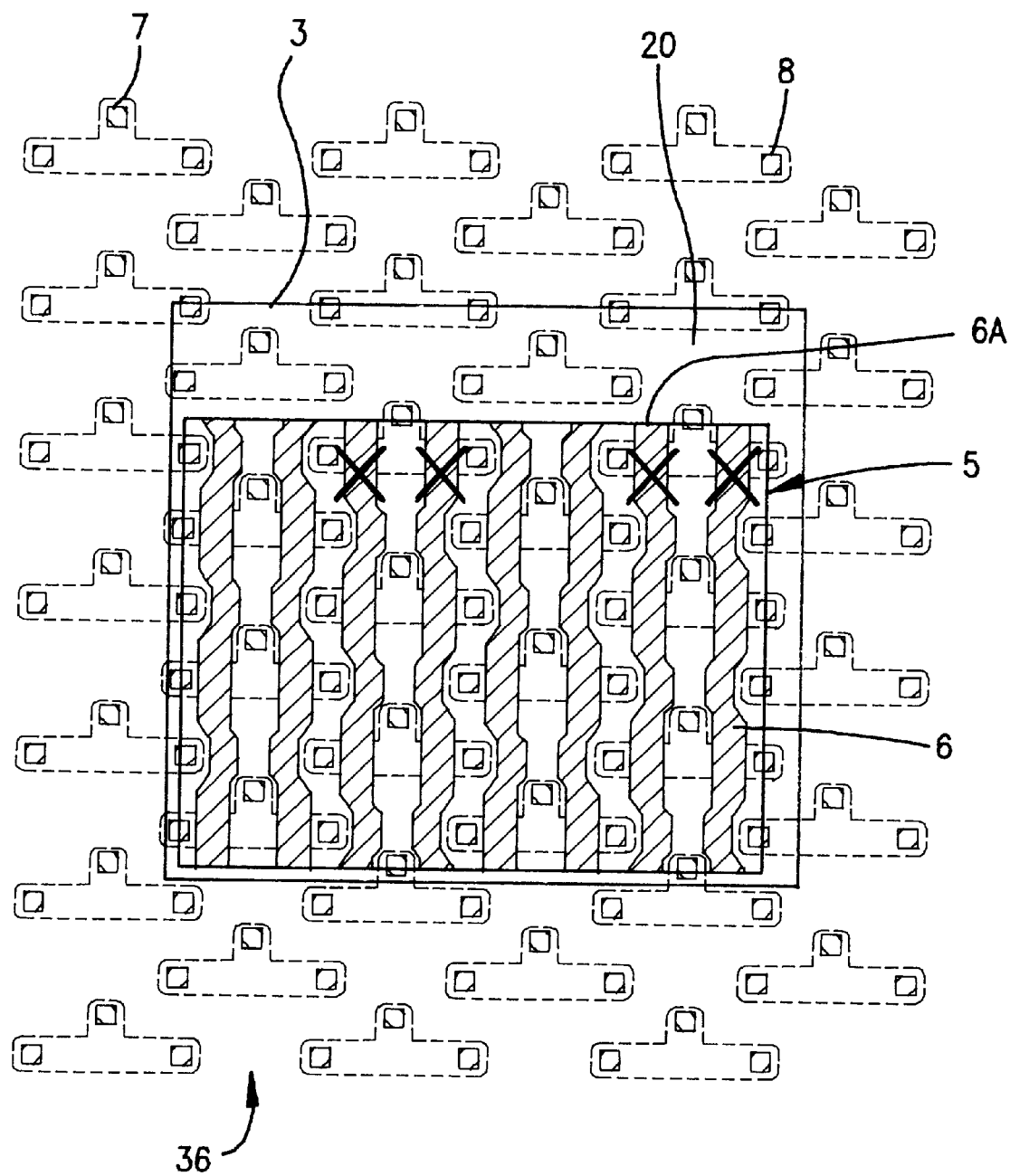
FIG. 26 is a view illustrative of a relationship between the active regions, capacitor and bit contacts and the repeating exposure pitch frame in a fifth embodiment in accordance with the present invention.
Figure 29:
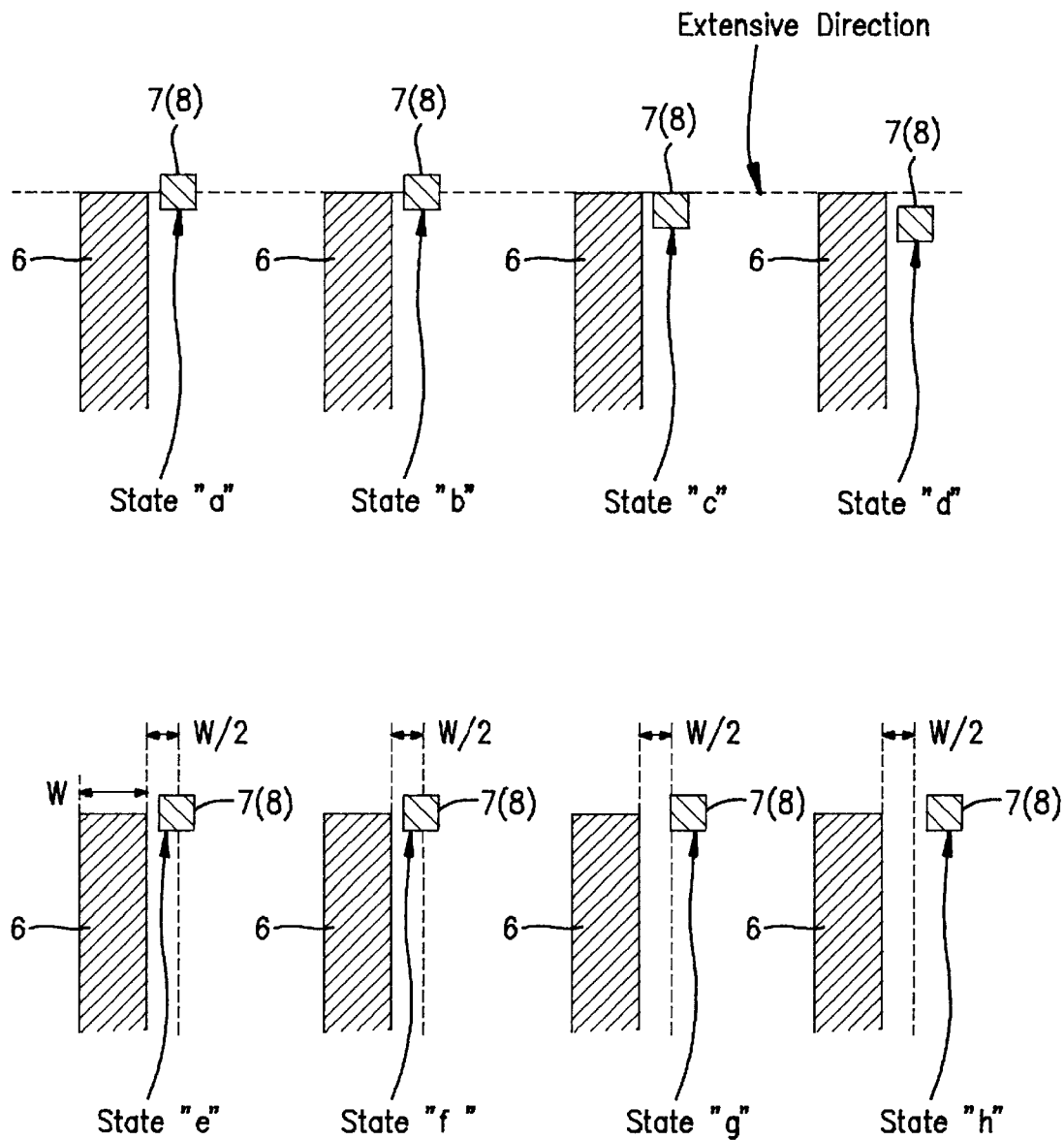
FIG. 29 is a view showing states "a" through "h", wherein the states "a", "b", "e" and "f" are the first state of the end portion of the divided word line pattern adjacent to the contact hole whilst the states "c", "d", "g" and "h" are the second state of the end portion of the divided word line pattern not adjacent to the contact hole in a fifth embodiment in accordance with the present invention.

FIG. 26 is a view illustrative of a relationship between the active regions 1, capacitor and bit contacts 8 and 7 and the repeating exposure pitch frame 5. Four of the divided word line patterns 6 marked by "X" have end portions which are located or positioned adjacent to the contact holes. FIG. 29 is a view showing states "a" through "h", wherein the states "a", "b", "e" and "f" are the first state of the end portion of the divided word line pattern adjacent to the contact hole 7 or 8 whilst the state "c", "d", "g" and "h" are the second state of the end portion of the divided word line pattern not adjacent to the contact hole 7 or 8.

Figure 27:
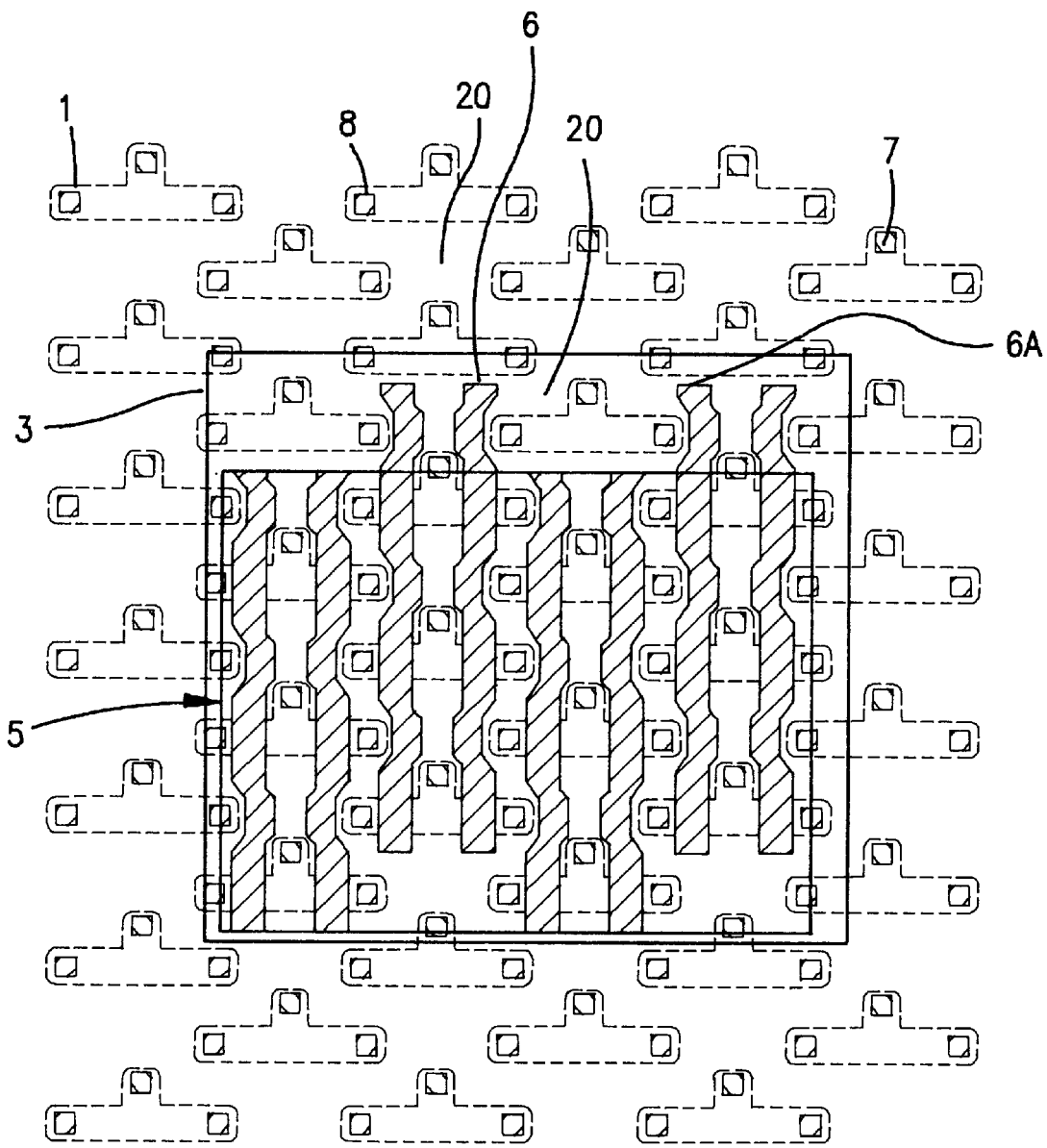
FIG. 27 is a view illustrative of re-layout of the divided word line patterns so that the ends of the four of the divided word line patterns marked by "X" are located in the isolation regions in a fifth embodiment in accordance with the present invention.

FIG. 27 is a view illustrative of re-layout of the divided word line patterns 6 so that the ends 6A of the four of the divided word line patterns marked by "X" are located in the isolation regions 20 and also the ends 6A of the four of the divided word line patterns marked by "X" are located not adjacent to the contact holes 7 and 8. If, however, any of the divided word line pattern 6 having been moved beyond the maximum exposure region 3, then it is required to verify whether all of the divided word line patterns 6 having been moved are located within the maximum exposure region 3 in a step 26 of FIG. 30. If all of the divided word line patterns 6 having been moved are located within the maximum exposure region 3, then a partial one-shot exposure mask is prepared in a step 28. If, however, any of the divided word line patterns 6 having been moved extend beyond the maximum exposure region 3, then the minimum repeating units aligned in the longitudinal direction of the word lines are reduced by one in a step 27 of FIG. 30. Then, the process is back to the step 24 wherein the re-layout of the divided word line patterns 6 are again carried out so that the ends of the four of the divided word line patterns 6 marked by "X" are moved from the active regions 1 to the isolation regions 20 whereby no ends of the eight divided word line patterns 6 are located in the active regions 1.

Figure 28:
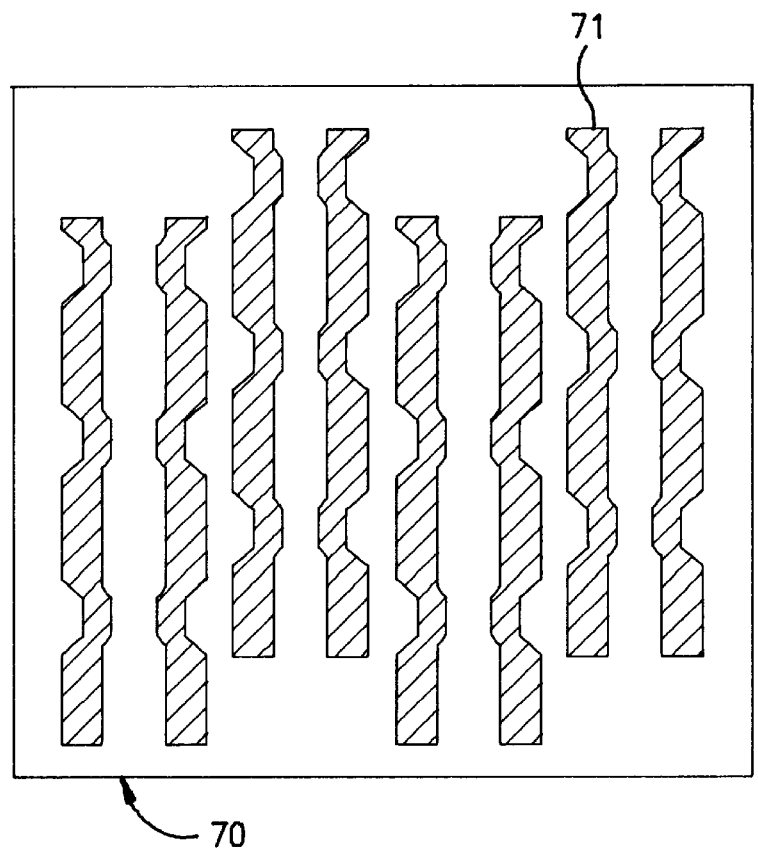
FIG. 28 is a view illustrative of a partial one-shot exposure mask having divided word line patterns having ends which are located in the isolation regions in a fifth embodiment in accordance with the present invention.

FIG. 28 is a view illustrative of a partial one-shot exposure mask having divided word line patterns having ends which are located in the isolation regions. FIG. 30 is a flow chart of showing processes for forming a partial one-shot exposure mask shown in FIG. 28. The partial one-shot exposure mask 70 is prepared in a method of FIG. 30 and has divided word line patterns 71 having ends which are located in the isolation regions.

The present invention can be applied to other cells as described in the foregoing embodiments.

Figure 31:
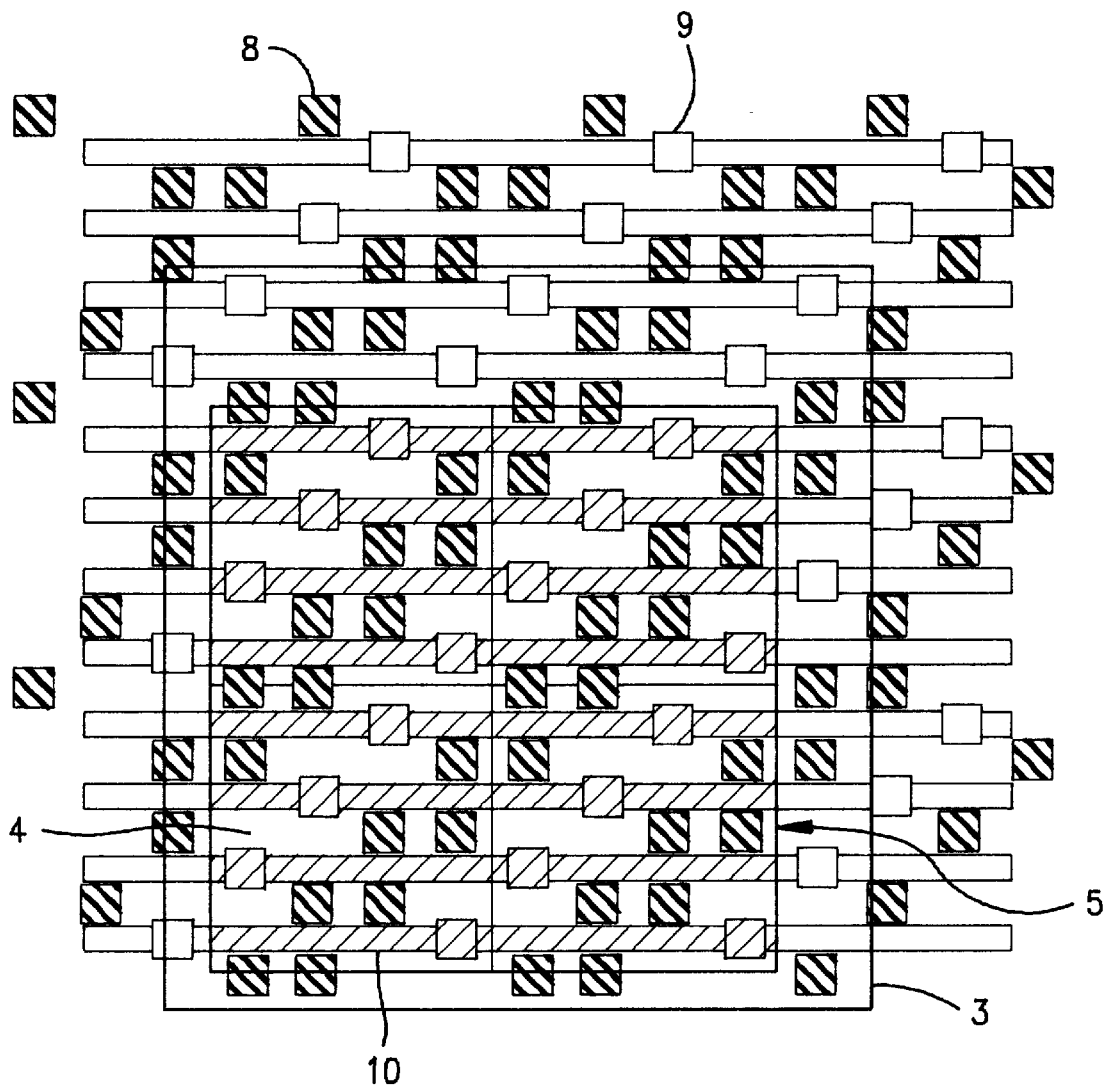
FIG. 31 is a view illustrative of divided bit line patterns of bit lines and repeating exposure pitch within the maximum exposure region, wherein the minimum repeating units are aligned within the maximum exposure region for determination of the unit pattern and divided bit line patterns in a sixth embodiment in accordance with the present invention.
Figure 32:
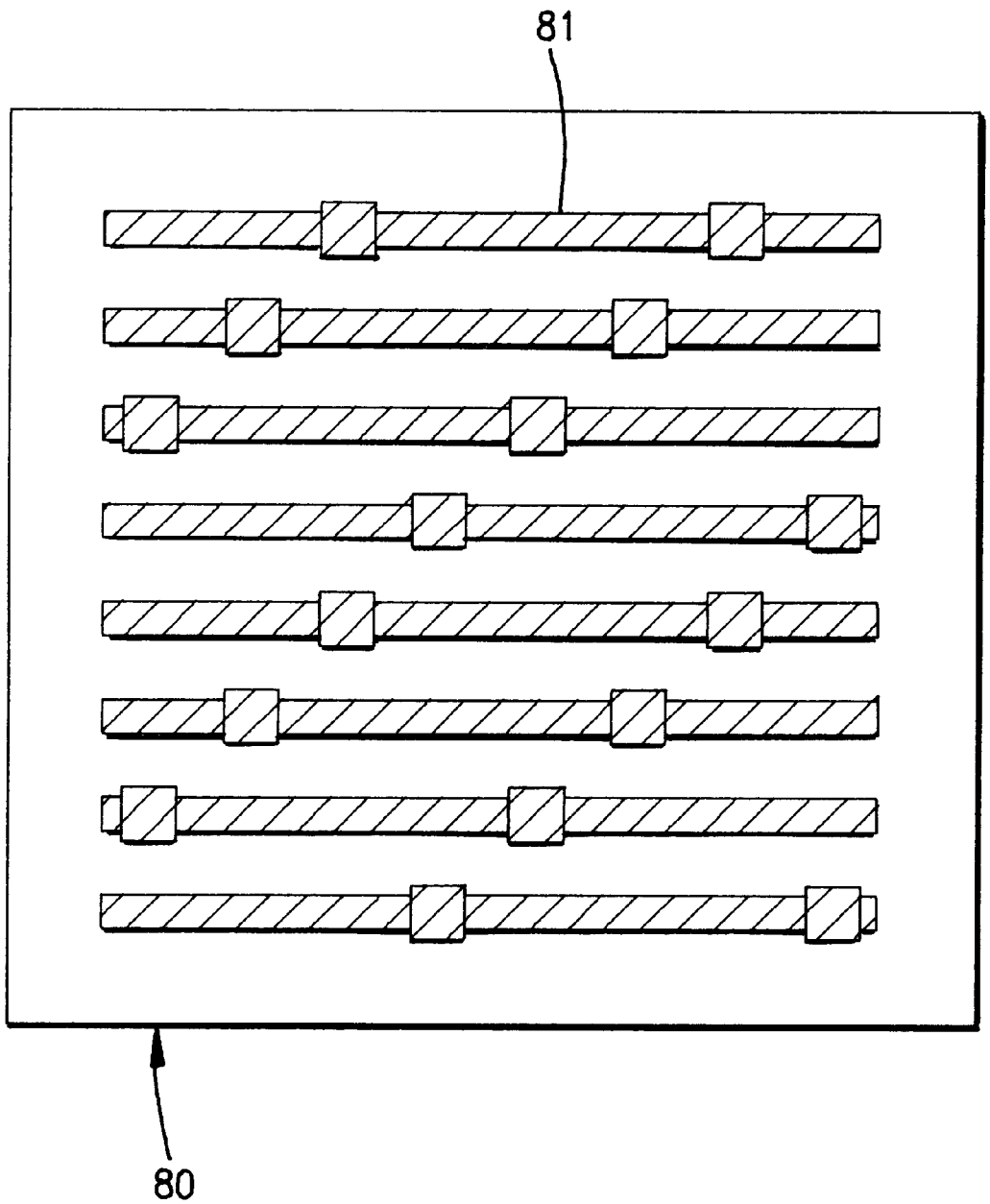
FIG. 32 is a view illustrative of a partial one-shot exposure mask having divided bit line patterns having ends which are located in the isolation regions in a sixth embodiment in accordance with the present invention.

Sixth Embodiment:

A sixth embodiment according to the present invention will be described in detail with reference to FIGS. 31 and 32. In this embodiment, the partial one-shot exposure mask is prepared for obtaining the bit line patterns in place of the word line patterns in which this embodiment is different from the fifth embodiment. FIG. 31 is a view illustrative of divided bit line patterns 10 of bit lines 9 and repeating exposure pitch 5 within the maximum exposure region 3, wherein the minimum repeating units 4 are aligned within the maximum exposure region 3 for determination of the unit patterns and divided bit line patterns. FIG. 32 is a view illustrative of a partial one-shot exposure mask having divided bit line patterns having ends which are located in the isolation regions.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An exposure mask in combination with a semiconductor memory which is to be exposed through said exposure mask, said memory comprising plural active regions that are spaced from each other by isolation regions, said active regions having longitudinal axes that are generally parallel to each other, and said exposure mask comprising plural openings with longitudinal axes that are generally parallel to each other, each of said openings overlaying a plurality of said active regions and a plurality of said isolation regions and having opposing longitudinal ends that each overlie a respective one of said isolation regions when said exposure mask is positioned on said memory.

2. The combination of claim 1, wherein said opposing ends of said openings are perpendicular to the longitudinal axes of said openings.

3. The combination of claim 2, wherein each of said opposing ends comprises a convex projection.

4. The combination of claim 1, wherein said opposing ends of said openings are parallel to the longitudinal axes of said active regions.

5. The combination of claim 4, wherein each of said opposing ends comprises a convex projection.

6. The combination of claim 1, wherein the longitudinal axes of said openings are oblique to the longitudinal axes of said active regions.

7. The combination of claim 1, wherein the longitudinal axes of said openings are perpendicular to the longitudinal axes of said active regions.

8. The combination of claim 1, wherein each of said active regions comprises at least one contact hole, wherein said openings in said exposure mask have a first width, and wherein said longitudinal ends of said openings are at least one of (i) spaced from said contact holes by at least one-half the first width and (ii) outside a projection of an adjacent one of said contact holes in a direction perpendicular to the longitudinal axes of said openings, when said exposure mask is positioned on said memory.

9. An exposure mask in combination with a semiconductor memory which is to be exposed through said exposure mask, said memory comprising plural active regions that are spaced from each other by isolation regions, each of said active regions having at least one contact hole, and said exposure mask comprising plural openings with longitudinal axes that are generally parallel to each other and have a first width, each of said openings overlying a plurality of said active regions and a plurality of said isolation regions and having opposing longitudinal ends that are at least one of (i) spaced from said contact holes by at least one-half the first width and (ii) outside a projection of an adjacent one of said contact holes in a direction perpendicular to the longitudinal axes of said openings, when said exposure mask is positioned on said memory.

10. A method of patterning a semiconductor memory with an exposure mask, the memory having plural active regions that are spaced from each other by isolation regions where the active regions have longitudinal axes that are generally parallel to each other and the exposure mask having plural openings with longitudinal axes that are generally parallel to each other, the method comprising the steps of:

(a) placing the exposure mask over a portion of the memory so that each of the openings overlies a plurality of the active regions and a plurality of the isolation regions and so that each longitudinal end of each of the openings overlies a respective one of said isolation regions;

(b) exposing the portion of the memory through the openings; and (c) repeating steps (a) and (b) over different portions of the memory until a pattern having plural continuous, elongated parts is formed, each of the elongated parts being formed by exposing the memory through a plurality of said openings end-to-end where respective longitudinal ends of the exposed portions meet over respective isolation regions.

11. A method of patterning a semiconductor memory with an exposure mask, the memory having plural active regions that are spaced from each other by isolation regions where each of the active regions has at least one contact hole and the exposure mask having plural openings with longitudinal axes that are generally parallel to each other, the method comprising the steps of:

(a) placing the exposure mask over a portion of the memory so that each of the openings overlies a plurality of the active regions and a plurality of the isolation regions and so that each longitudinal end of each of the openings is at least one of (i) spaced from the contact holes by at least one-half the first width and (ii) outside a projection of an adjacent one of the contact holes in a direction perpendicular to the longitudinal axes of the openings;

(b) exposing the portion of the memory through the openings; and (c) repeating steps (a) and (b) over different portions of the memory until a pattern having plural continuous, elongated parts is formed, each of the elongated parts being formed by exposing the memory through a plurality of said openings end-to-end where respective longitudinal ends of the exposed portions meet at positions that are least one of (i) spaced from the contact holes by at least one-half the first width and (ii) outside the projection of an adjacent one of the contact holes in the direction perpendicular to the longitudinal axes of the openings.

* * * * *